(12) United States Patent
Jun et al.

(10) Patent No.: US 9,999,149 B2
(45) Date of Patent: Jun. 12, 2018

(54) ELECTRONIC DEVICE

(71) Applicant: Samsung Electronics Co., Ltd., Suwon-si, Gyeonggi-do (KR)

(72) Inventors: Sung-Soo Jun, Seoul (KR); Sung-Eun Park, Hwaseong-si (KR); Chang-Ok Lim, Suwon-si (KR); Min-Woo Yoo, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/442,448

(22) Filed: Feb. 24, 2017

(65) Prior Publication Data

US 2017/0251564 A1 Aug. 31, 2017
US 2018/0110148 A9 Apr. 19, 2018

(30) Foreign Application Priority Data

Feb. 25, 2016 (KR) .......................... 10-2016-0022850

(51) Int. Cl.
*G06K 9/00* (2006.01)
*H05K 5/06* (2006.01)
*H05K 5/02* (2006.01)
*H04R 1/02* (2006.01)

(52) U.S. Cl.
CPC ............... *H05K 5/069* (2013.01); *H04R 1/02* (2013.01); *H05K 5/0217* (2013.01); *H04R 2499/11* (2013.01)

(58) Field of Classification Search
None
See application file for complete search history.

(56) References Cited

U.S. PATENT DOCUMENTS

| 2013/0251183 A1* | 9/2013 | Doller ................ H04R 1/086 381/368 |
| 2013/0311873 A1 | 11/2013 | Kim |
| 2014/0294217 A1 | 10/2014 | Yamaguchi et al. |
| 2015/0114090 A1 | 4/2015 | Fukuda |

FOREIGN PATENT DOCUMENTS

| JP | 2010-109851 A | 5/2010 |
| JP | 2012-134443 A | 7/2012 |
| JP | 2012-186549 A | 9/2012 |
| KR | 10-2013-0129623 A | 11/2013 |
| KR | 10-2014-0118726 A | 10/2014 |
| KR | 10-2015-0049292 A | 5/2015 |

* cited by examiner

*Primary Examiner* — Curtis Kuntz
*Assistant Examiner* — Kenny Truong

(57) ABSTRACT

An electronic device is provided. The electronic device includes a housing including a first surface facing in a first direction, a second surface facing in a second direction opposite to the first direction, and a side surface surrounding at least a part of a space between the first surface and the second surface, an opening formed on at least one of the first surface, the second surface, or the side surface, a first channel extended from the opening, a second channel connected to at least a part of the first channel and extended to an inner space of the housing, an audio mounted inside the housing and connected to the opening through the first channel, a first member inserted into the first channel, and a second member inserted into the second channel, for allowing and restricting introduction and discharge of air into and from the inner space of the housing.

12 Claims, 25 Drawing Sheets

ELECTRONIC DEVICE

CROSS-REFERENCE TO RELATED APPLICATION AND CLAIM OF PRIORITY

The present application is related to and claims priority under 35 U.S.C. § 119(a) to Korean Application Serial No. 10-2015-0022850, which was filed in the Korean Intellectual Property Office on Feb. 25, 2016, the entire content of which is hereby incorporated by reference.

TECHNICAL FIELD

The present disclosure relates generally to an electronic device, and more particularly, to an electronic device such as a waterproof electronic device, which has a structure for maintaining the difference between the internal and ambient atmospheric pressures of the electronic device constant.

BACKGROUND

Various embodiments of the present disclosure relate to an electronic device. For example, in a waterproof electronic device, an air vent hole is formed to maintain the difference between the internal and ambient atmospheric pressures of the electronic device constant. Without the air vent hole, the waterproof electronic device experiences air expansion and an increase in internal pressure due to external pressure or an external impact, thus deforming a case member. Besides, an atmospheric pressure sensor may not operate, or a malfunction may occur in view of restoration failure of a vibration diaphragm of a receiver in a low frequency band.

The air vent hole is formed in an inner housing of the electronic device in order to maintain the difference between the internal and ambient atmospheric pressures of the electronic device constant. For example, an opening may be formed at a predetermined position around a battery in the inner housing or at least at a predetermined position of a side surface of the inner housing, so that air may flow between the inside and outside of the electronic device and thus the difference between the internal and ambient atmospheric pressures of the electronic device may be maintained constant.

The air vent hole may be covered by an external cover that covers the inner housing of the electronic device or by a side decoration mounted along the side periphery of the electronic device. Thus, the air vent hole is not exposed outward.

As described above, the air vent hole should be covered by an additional external cover or decoration in the waterproof electronic device. In other words, the electronic device requires an additional external cover or decoration to prevent outward exposure of the air vent hole.

Moreover, if the external cover is integrated with the electronic device, the air vent hole may be exposed outward, thereby making the outward looks of the electronic device less attractive.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide at least the advantages described below. Accordingly, an aspect of the present disclosure is to provide an electronic device such as a waterproof electronic device, which has a structure for maintaining the difference between the internal and ambient atmospheric pressures of the electronic device constant.

In accordance with an aspect of the present disclosure, there is provided an electronic device. The electronic device includes a housing including a first surface facing in a first direction, a second surface facing in a second direction opposite to the first direction, and a side surface surrounding at least a part of a space between the first surface and the second surface, an opening formed on at least one of the first surface, the second surface, and the side surface, a first channel extended from the opening, a second channel connected to at least a part of the first channel and extended to an inner space of the housing, an audio mounted inside the housing and connected to the opening through the first channel, for audio communication, a first member inserted into the first channel, for tightly sealing the audio, and a second member inserted into the second channel, for allowing introduction and discharge of air into and from the inner space of the housing, and restricting introduction and discharge of water or moisture into and from the inner space of the housing.

In accordance with another aspect of the present disclosure, there is provided an electronic device. The electronic device includes an outer housing including a first surface facing in a first direction, a second surface facing in a second direction opposite to the first direction, and a side surface surrounding at least a part of a space between the first surface and the second surface, an inner housing mounted inside the outer housing, an opening formed on at least one of the first surface, the second surface, and the side surface of the outer housing, a first channel part extended from the opening, between the outer housing and the inner housing, circuitry mounted inside the inner housing, a second channel part provided in the inner housing, connected to the opening through the first channel part, and including a first channel extended from the opening directly to the circuitry through the first channel part, and a second channel provided in the vicinity of the first channel, extended to the opening through a connection space of at least a part of the first channel part, and extended to an inner space of the inner housing, and a stacked member unit mounted inside the first channel part, for sealing the first channel part and restricting introduction and discharge of water or moisture except for air into and from the first channel and the second channel.

Other aspects, advantages, and salient features of the disclosure will become apparent to those skilled in the art from the following detailed description, which, taken in conjunction with the annexed drawings, discloses exemplary embodiments of the disclosure. Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1A:
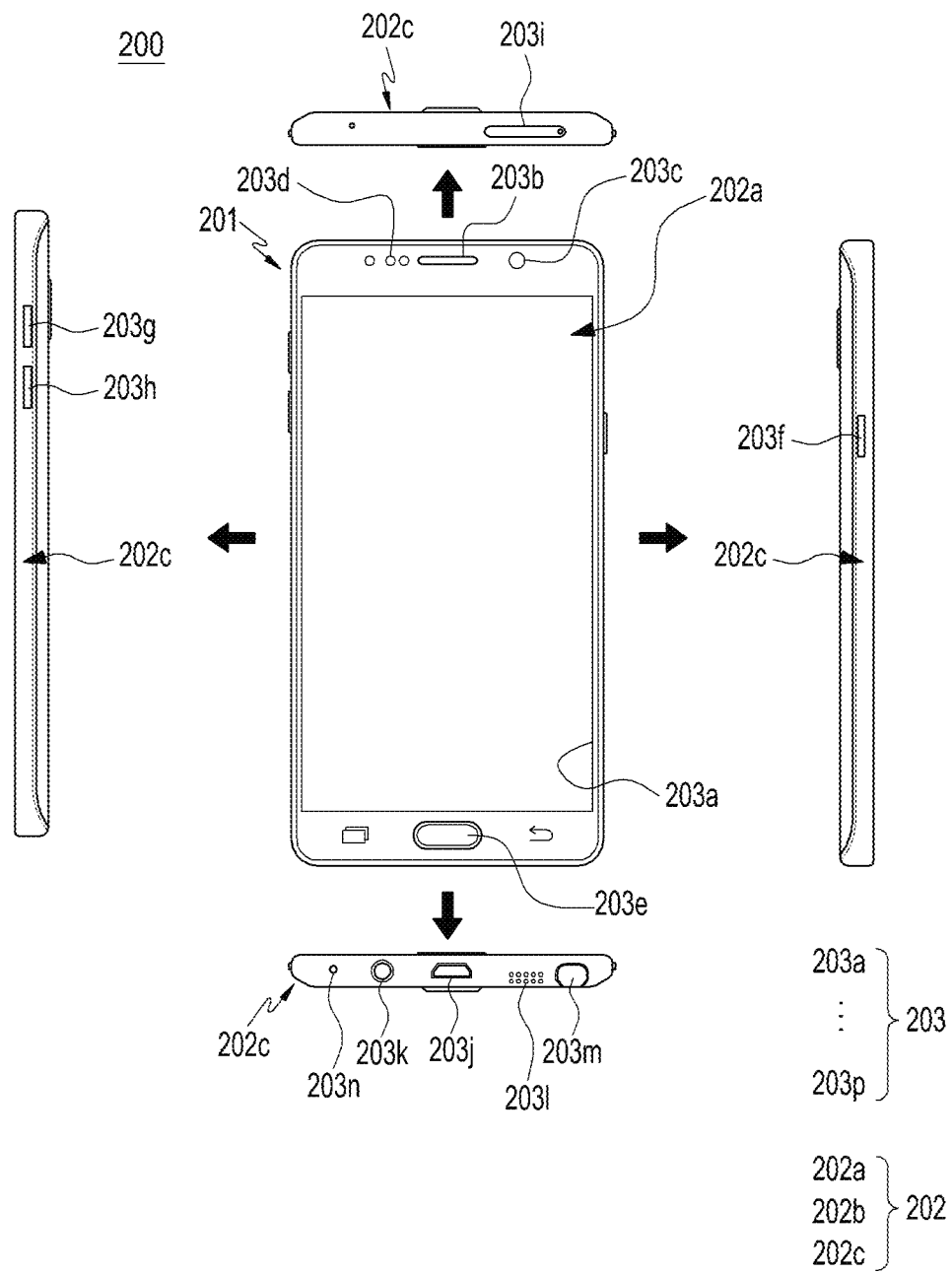
FIG. 1A illustrates the front surface and four side surfaces of an electronic device according to various embodiments of the present disclosure.

FIGS. 1A through 17, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Various embodiments of the present disclosure are described with reference to the accompanying drawings. However, the scope of the present disclosure is not intended to be limited to the particular embodiments, and it is to be understood that the present disclosure covers all modifications, equivalents, and/or alternatives falling within the scope and spirit of the present disclosure. In relation to a description of the drawings, like reference numerals denote the same components.

In the present disclosure, the term 'have', 'may have', 'include', or 'may include' signifies the presence of a specific feature (for example, number, function, operation, or component such as part), not excluding the presence of one or more other features.

In present disclosure, the term 'A or B', 'at least one of A or/and B', or 'one or more of A or/and B' may cover all possible combinations of enumerated items. For example, 'A or B', 'at least one of A and B', or 'at least one of A or B' may represent all of the cases of (1) inclusion of at least one A, (2) inclusion of at least one B, and (3) inclusion of at least one A and at least one B.

The term as used in the present disclosure, 'first' or 'second' may modify the names of various components irrespective of sequence and/or importance, not limiting the components. These expressions are used to distinguish one component from another component. For example, a first user equipment (UE) and a second UE may indicate different UEs irrespective of sequence or importance. For example, a first component may be referred to as a second component and vice versa without departing from the scope of the present disclosure.

When it is said that a component (for example, a first component) is 'operatively or communicatively coupled with/to' or 'connected to' another component (for example, a second component), it should be understood that the one component is connected to the other component directly or through any other component (for example, a third component). On the other hand, when it is said that a component (for example, a first component) is 'directly connected to' or 'directly coupled to' another component (for example, a second component), it may be understood that there is no other component (for example, a third component) between the components.

The term 'configured to' as used herein may be replaced with, for example, the term 'suitable for' 'having the capacity to', 'designed to', 'adapted to', 'made to', or 'capable of' under circumstances. The term 'configured to' may not necessarily mean 'specifically designed to' in hardware. Instead, the term 'configured to' may mean that a device may mean 'capable of' with another device or part. For example, 'a processor configured to execute A, B, and C' may mean a dedicated processor (for example, an embedded processor) for performing the corresponding operations or a generic-purpose processor (for example, a central processing unit (CPU) or an application processor (AP)) for performing the operations.

The terms as used in the present disclosure are provided to describe merely specific embodiments, not intended to limit the scope of other embodiments. It is to be understood that singular forms include plural referents unless the context clearly dictates otherwise. Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings. When needed, even the terms as defined in the present disclosure may not be interpreted as excluding embodiments of the present disclosure.

An electronic device according to various embodiments of the present disclosure may be at least one of, for example, a smartphone, a tablet personal computer (PC), a mobile phone, a video phone, an e-book reader, a desktop PC, a laptop PC, a netbook computer, a workstation, a server, an personal digital assistant (PDA), a portable multimedia player (PMP), an MP3 player, a mobile medical equipment, a camera, or a wearable device. According to various embodiments, the wearable device may be at least one of an accessory type (for example, a watch, a ring, a bracelet, an ankle bracelet, a necklace, glasses, contact lenses, or a head-mounted device (HMD)), a fabric or clothes type (for example, electronic clothes), a body-attached type (for example, a skin pad or a tattoo), or an implantable type (for example, an implantable circuit).

According to some embodiments, an electronic device may be a home appliance. For example, the home appliance may be at least one of, for example, a television (TV), a digital versatile disk (DVD) player, an audio player, a refrigerator, an air conditioner, a vacuum cleaner, an oven, a microwave oven, a washer, an air purifier, a set-top box, a home automation control panel, a security control panel, a TV box (for example, Samsung HomeSync™, Apple TV™, Google TV™, or the like), a game console (for example, Xbox™, PlayStation™, or the like), an electronic dictionary, an electronic key, a camcorder, or an electronic picture frame.

According to other embodiments, an electronic device may be at least one of a medical device (for example, a portable medical meter such as a blood glucose meter, a heart rate meter, a blood pressure meter, or a body temperature meter, a magnetic resonance angiography (MRA) device, a magnetic resonance imaging (MRI) device, a computed tomography (CT) device, an imaging device, an ultrasonic device, or the like), a navigation device, a global navigation satellite system (GNSS), an event data recorder (EDR), a flight data recorder (FDR), an automotive infotainment device, a naval electronic device (for example, a naval navigation device, a gyrocompass, or the like), an avionic electronic device, a security device, an in-vehicle head unit, an industrial or consumer robot, an automatic teller machine (ATM) in a financial facility, a point of sales (POS) device in a shop, or an Internet of things (IoT) device (for example, a lighting bulb, various sensors, an electricity or gas meter, a sprinkler, a fire alarm, a thermostat, a street lamp, a toaster, sports goods, a hot water tank, a heater, or a boiler).

According to some embodiments, an electronic device may be at least one of furniture, part of a building/structure, an electronic board, an electronic signature receiving device, a projector, and various measuring devices (for example, water, electricity, gas or electro-magnetic wave measuring devices). According to various embodiments, an electronic device may be one or a combination of two or more of the foregoing devices. According to some embodiments, an electronic device may be a flexible electronic device. In addition, it will be apparent to one having ordinary skill in the art that an electronic device according to an embodiment of the present disclosure is not limited to the foregoing devices and covers a new electronic device produced along with technology development.

Figure 1B:
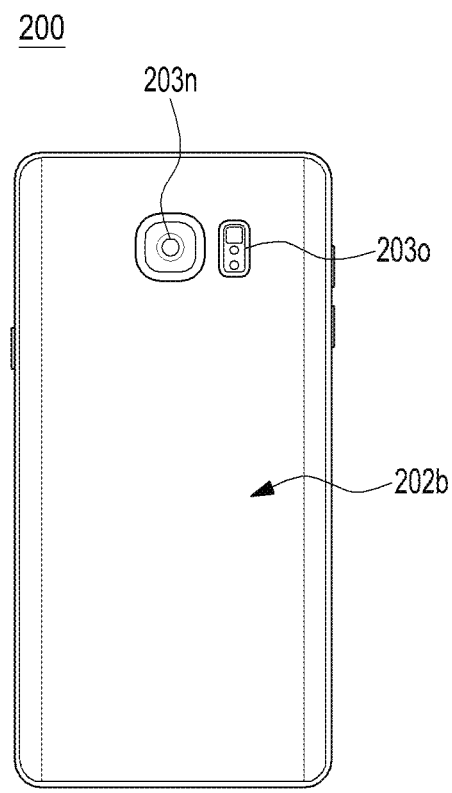
FIG. 1B illustrates the rear surface of an electronic device according to various embodiments of the present disclosure.
Figure 1C:
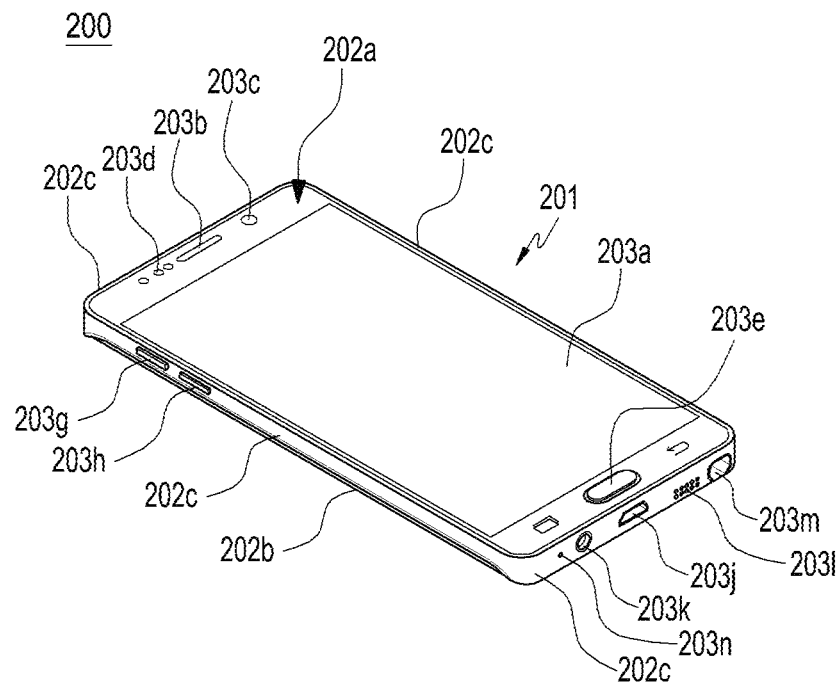
FIG. 1C illustrates a perspective view of an electronic device according to various embodiments of the present disclosure.
Figure 1D:
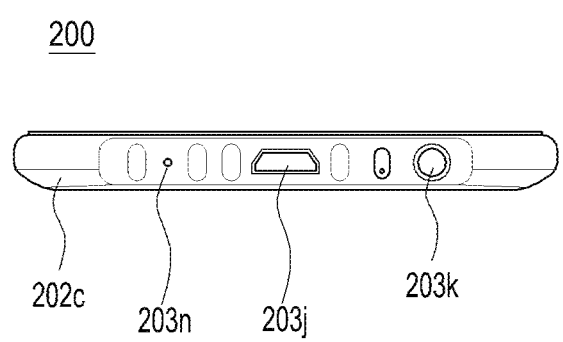
FIG. 1D illustrates components arranged on at least one side surface of an electronic device according to various embodiments of the present disclosure.

FIG. 1A illustrates the front surface and four side surfaces 202c of an electronic device 200 according to various embodiments of the present disclosure. FIG. 1B illustrates the rear surface of the electronic device 200 according to various embodiments of the present disclosure. FIG. 1C is a perspective view of the electronic device 200 according to various embodiments of the present disclosure. FIG. 1D illustrates components arranged on at least one side surface 202c of the electronic device 200 according to various embodiments of the present disclosure.

Referring to FIGS. 1A to 1D, the electronic device 200 according to an embodiment may include a housing 201, a display 210, input devices 203e, 203f, 203g, 203h, and 203m that operate in various schemes, a channel unit, circuitry, antenna 270 and 280, and a stacked member unit 10.

According to an embodiment, the housing 201 may include outer housings 201a and 201c, and an inner housing 201b. Under circumstances, the housing 201 may be configured by integrating the outer housings 201a and 201c and the internal housing 201b into a single unit. On the other hand, the first and second outer housings 201a and 201c and the internal housing 201b may be separately configured and engaged with each other in the housing 201.

The outer housing 201a and 201c may include a first surface 202a, a second surface 202b, and the side surfaces 202c. The inner housing 201b may be mounted inside the outer housing 201a and 201c and function to support a circuit board or circuitry provided inside the outer housing 201a and 201c. The first surface 202a of the outer housings 201a and 201c is a surface facing in a first direction, the second surface 202b of the outer housings 201a and 201c is a surface facing in a second direction opposite to the first direction, and the side surfaces 202c of the outer housings 201a and 201c are surfaces surrounding at least a part of a space between the first surface 202a and the second surface 202b in the electronic device 200.

According to an embodiment, the display 210 may be provided on at least one of the first or second surface 202a or 202b of the outer housing 201a and 201c, for displaying a screen. That is, the display 210 may be disposed on one surface of the outer housing 201a, for example, the first surface 202a. The display 210 may occupy the entirety or part of the first surface 202a. The opposite surface of the surface of the outer housings 201a and 201c on which the display 210 is mounted may be provided to cover a battery for supplying power to the electronic device 200, mounted in a space defined in the inner housing 201b, from above the inner housing 201b. Various circuitry such as a camera device 203c, a speaker 203l, an illuminator 203d, and the input devices 203e, 203f, 203g, 203h, and 203m may be arranged in the first surface 202a, the second surface 202b, or the side surfaces 202c of the outer housing 201a and 201c, specifically inside the inner housing 201b. A connector for connecting the electronic device 200 to an external device, the antenna 270 and 280, and the battery may be arranged inside the inner housing 201b.

According to an embodiment of the present disclosure, the display 210 may be mounted on the front surface of the outer housing 201a and 201c, and configured to realize a touch input or proximity input of an object and display an image according to a user environment. The display 210 may be formed by stacking a display panel for displaying a screen on one surface of a touch panel, the touch panel, and a window glass at the outermost position. While the display 210 is provided on the first surface 202a of the outer housing 201a and 201c in an embodiment of the present disclosure, by way of example, many variations or modifications may be made according to settings of the electronic device 200. Thus, the display 210 may be provided on the second surface 202b or both the first and second surfaces 202a and 202b of the outer housing 201a and 201c.

The display 210, which forms or is mounted on the first surface 202a of the outer housings 201a and 201c, may be configured by stacking a touch panel, a display unit, and so on, and display an input received through an object having electric charge such as a hand, or circuitry such as a digitizer pen or a stylus pen, and an output corresponding to the input.

According to various embodiments of the present disclosure, the display 210 may receive continuous movement of one touch as an input, from among at least one touch. In various embodiments of the present disclosure, 'touch' includes non-contact, for example, proximity, not limited to direct contact of a user's body or circuitry such as a stylus pen. A gap detectable by the display 210 may be changed according to the performance or structure of the electronic device 200.

Figure 2:
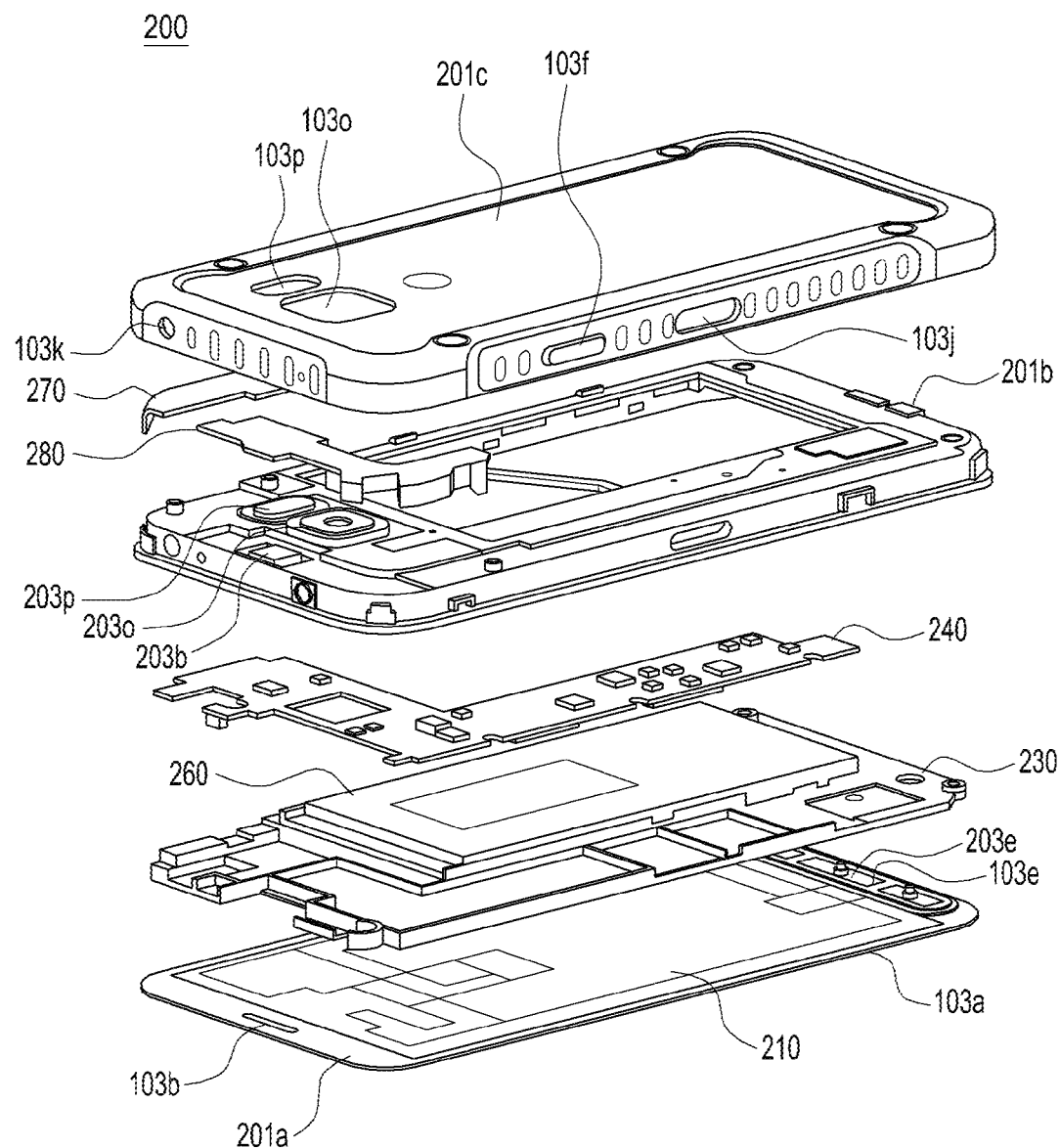
FIG. 2 illustrates an exploded perspective view of an electronic device according to various embodiments of the present disclosure, seen from one direction.
Figure 3:
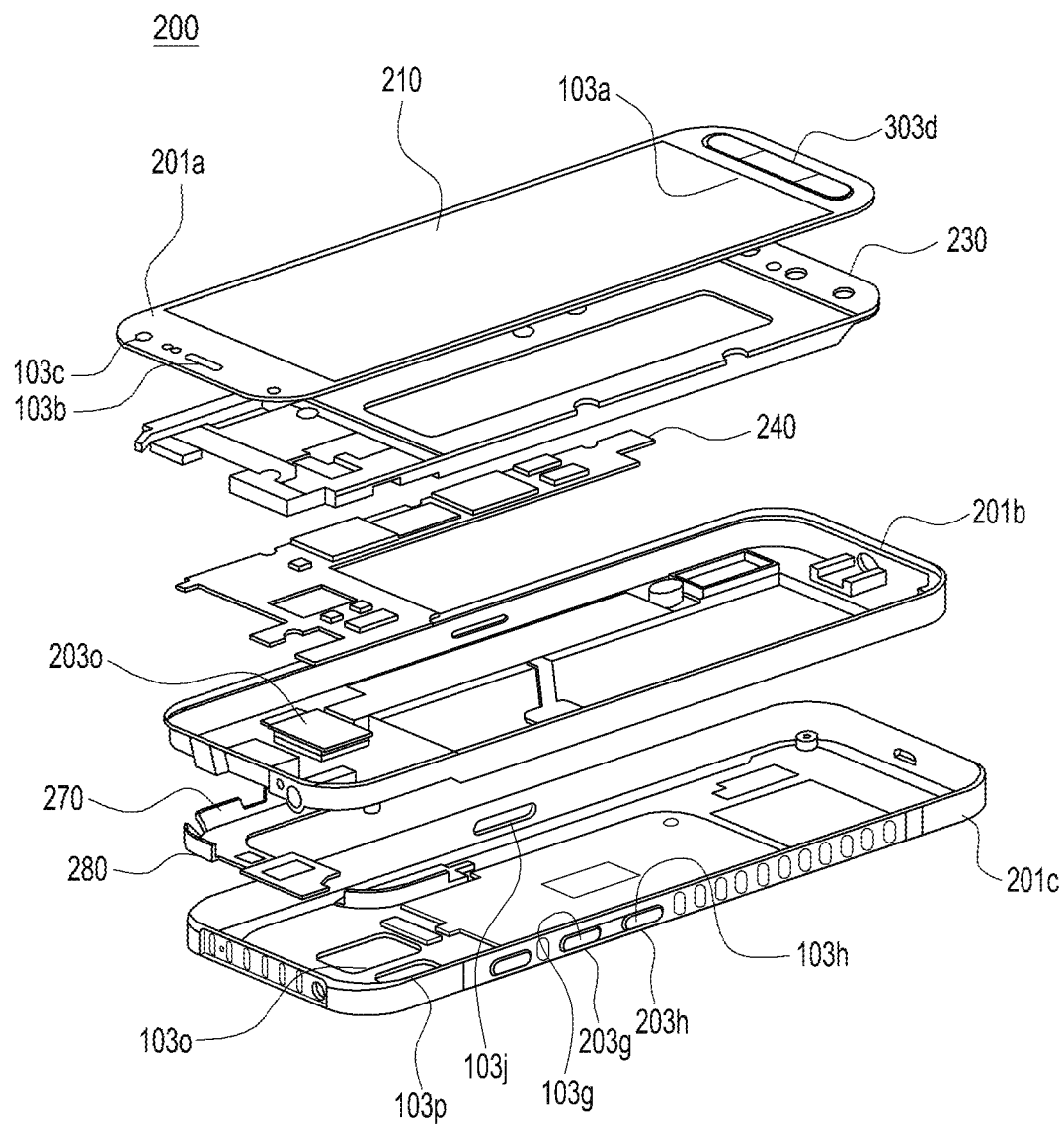
FIG. 3 illustrates an exploded perspective view of an electronic device according to various embodiments of the present disclosure, seen from another direction.

FIG. 2 illustrates an exploded perspective view of the electronic device 200 according to various embodiments of the present disclosure, seen from one direction, and FIG. 3 is an exploded perspective view of the electronic device 200 according to various embodiments of the present disclosure, seen from another direction.

Referring to FIGS. 2 and 3, according to an embodiment, various circuitry may be mounted in the electronic device 200, for example, the inner housing 201b. For example, the display 210, a bracket 230, and a circuit board 240 may be mounted in the inner housing 201b. One or more antenna s 270 and 280 of various types may be mounted for transmission and reception of the electronic device 200.

Circuitry including a camera, the speaker 203l, a microphone 203n, the physical buttons 203e, 203f, 203g, and 203h, a service light 203d, an ear jack device 203k, a connector 203j, the input member 203m such as a stylus pen, and so on may be mounted inside the housing 201 in such a manner that the circuitry may be exposed outward from the housing 201 or connectable to the outside of the electronic device 200.

According to an embodiment, circuitry may be at least one of the audio device 203b, 203n, and 203l, the camera device 203c, the connector 203j connected to an external device, the buttons 203e, 203f, 203g, and 203h for applying an input, and the illuminator 203d for emitting light.

According to an embodiment, openings 103a to 103p (commonly denoted by reference numeral 103) are formed on the first surface 202a, the second surface 202b, or the side surfaces 202c of the outer housing 201a and 201c, so that circuitry arranged inside the inner housing 201b or between the inner housing 201b and the outer housing 201a and 201c may be recognized from the outside or exposed outward (refer to FIGS. 1A to 1D). The openings 103a to 103p may be formed at least one of the first surface 202a, the second surface 202b, or the side surfaces 202c of the outer housing 201a and 201c, at positions corresponding to the positions of the circuitry. Covers may be separately provided to cover the openings 103a to 103p or the circuitry exposed through the openings 103a to 103p.

For example, if the display 210 is mounted on the first surface 202a of the outer housing 201a and 201c, the front camera device 203c, the service light 203d, the speaker 203l, the microphone 203n, the main button 203e, and so on may be provided around the display 210. For this purpose, the various openings 103a to 103p may be formed in the outer housing 201a and 201c, inclusive of an opening for exposing a front camera (corresponding to the camera device 203c) and an opening for exposing the service light 203d (corresponding to the illuminator 203d) around the display 210 on the first surface 202a of the outer housing 201a and 201c, and an opening for exposing the speaker 203l (corresponding to the audio device 203b, 203n, and 203l), an opening for exposing the microphone 203n (corresponding to the audio device 203b, 203n, and 203l), and an opening for exposing the main button (corresponding to an input member) in the outer housing 201a and 201c.

A rear camera 203o, a light 203p, and an additional button (not shown) may be provided on the second surface 202b of the outer housing 201a and 201c. For this purpose, the opening 103o for exposing the rear camera 203o (corresponding to the camera device 203c), the opening 103p for exposing the light 203p (corresponding to the illuminator 203d), and an opening for the additional button (not shown) may be formed on the second surface 202b of the outer housing 201a and 201c.

The power button 203f, the up and down buttons 203g and 203h, the connector 203j for connection to an external input port, the ear jack device 203k for connection to a jack such as an earphone, and the input member 203m such as a stylus pen may be provided on the side surfaces 202c of the outer housing 201a and 201c. For this purpose, the openings 103g and 103h for mounting the up and down buttons 203g and 203h, the opening 103j for the connector 203j, the opening 103k for the ear jack device 203k, and the opening 103m for attaching and detaching the input member 203m may be formed on the side surfaces 202c of the outer housing 201a and 201c.

Figure 4A:
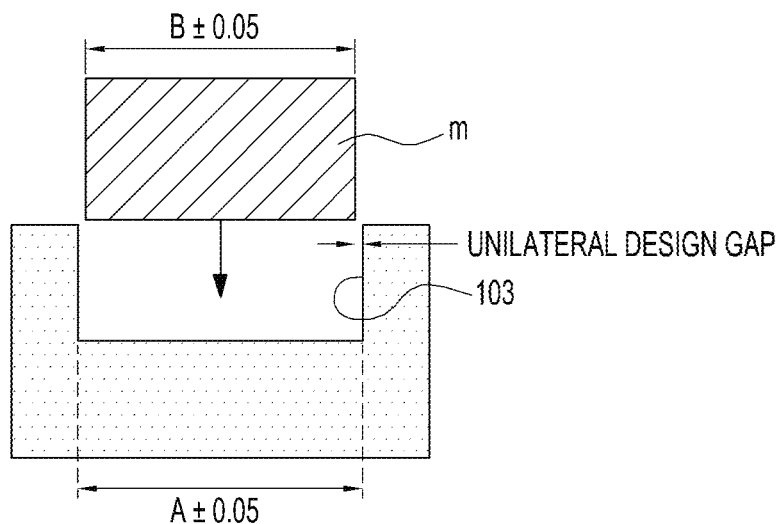
FIGS. 4A and 4B illustrate a shape-matching hole and a functional hole, respectively in an electronic device according to various embodiments of the present disclosure.
Figure 4B:
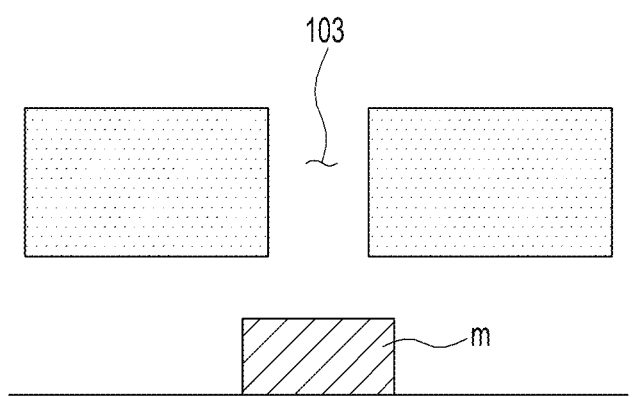

FIGS. 4A and 4B illustrate a shape-matching hole and a functional hole, respectively in the electronic device 200 according to various embodiments of the present disclosure.

Referring to FIGS. 4A and 4B, and Table 1 below, the openings 103a to 103p may be classified into at least one type of shape-matching hole and functional hole.

TABLE 1

| | Opening type | |
|---|---|---|
| | Shape-matching hole (refer to FIG. 4A) | Functional hole (refer to FIG. 4B) |
| Generation purpose | An opening 103 for mounting circuitry m in the housing 201. The opening 103 is a hole to be considered in the design stage to mount the circuitry m in the opening 103. | The openings for the audio device 203b, 203n, and 203l, the opening for the camera 203c, the opening for the ear jack device 203k, the opening for the input member 203m such as a stylus pen, and the opening for the connector 203j. These openings are holes for connection to the outside. |

Referring to Table 1 above, an opening 103 may be formed to mount circuitry m in the housing 201, specifically the outer housing 201a and 201c, or to connect circuitry m mounted inside the outer housing 201a and 201c to the outside. Depending on how circuitry m are mounted in the housing, the openings may be classified into shape-matching holes (see FIG. 4A) into which the circuitry m are fit and functional holes (see FIG. 4B) to which circuitry m provided inside the inner housing 201b are connected through an additional channel unit.

Referring to FIG. 4A, a shape-matching hole may be formed in a similar circumferential size to that of an opening so that circuitry m may be mounted in the opening. The shape-matching hole is formed to be larger than the circuitry m by a predetermined size so that the shape-matching hole may have a gap to overcome some error that may be generated in the process of the circuitry m or the shape-matching hole. That is, the size of an opening in which circuitry m is mounted is designed to be large relative to the size of the circuitry m, with a predetermined gap between the opening and the circuitry m. For example, if the size of the circuitry m is 'B', the gap may be set to ±0.05 mm. If the size of the opening 103 is 'A', the gap is ±0.05 mm. Thus, the maximum size of the circuitry m may be 'B+0.05 mm', and the minimum size of the opening 103 may be 'A−0.05 mm'. If a minimum available gap is designed between the circuitry m and the opening 103, the size of the opening 103 may be 'A=B+0.1 mm' by 'B+0.05=A−0.05'. Therefore, it is necessary to design a gap of 0.1 mm or larger between the opening and the circuitry m, and to design a unilateral gap of 0.05 mm or larger.

In the electronic device 200, circuitry m including the illuminator 203d such as a service light, the camera device 203c such as a camera, or the display 210 are mounted in openings 103. The openings 103 in which the circuitry m are mounted may be referred to as shape-matching holes or openings.

Referring to FIG. 4, a functional hole may be an opening for circuitry m mounted inside the inner housing 201b, for example, an opening for connecting circuitry m such as the speaker 203l or the microphone 203n mounted inside the inner housing 201b, an opening for the ear jack device 203k, an opening for the input member 203m such as a stylus pen, or an opening for the connector 203j. These openings 103 may be referred to as functional holes or openings.

Now, a description will be given of the audio device 203b, 203n, and 203l, the openings in which the audio device 203b, 203n, and 203l is formed, and their structures. Obviously, the same description is also applicable to other structures.

Figure 5A:
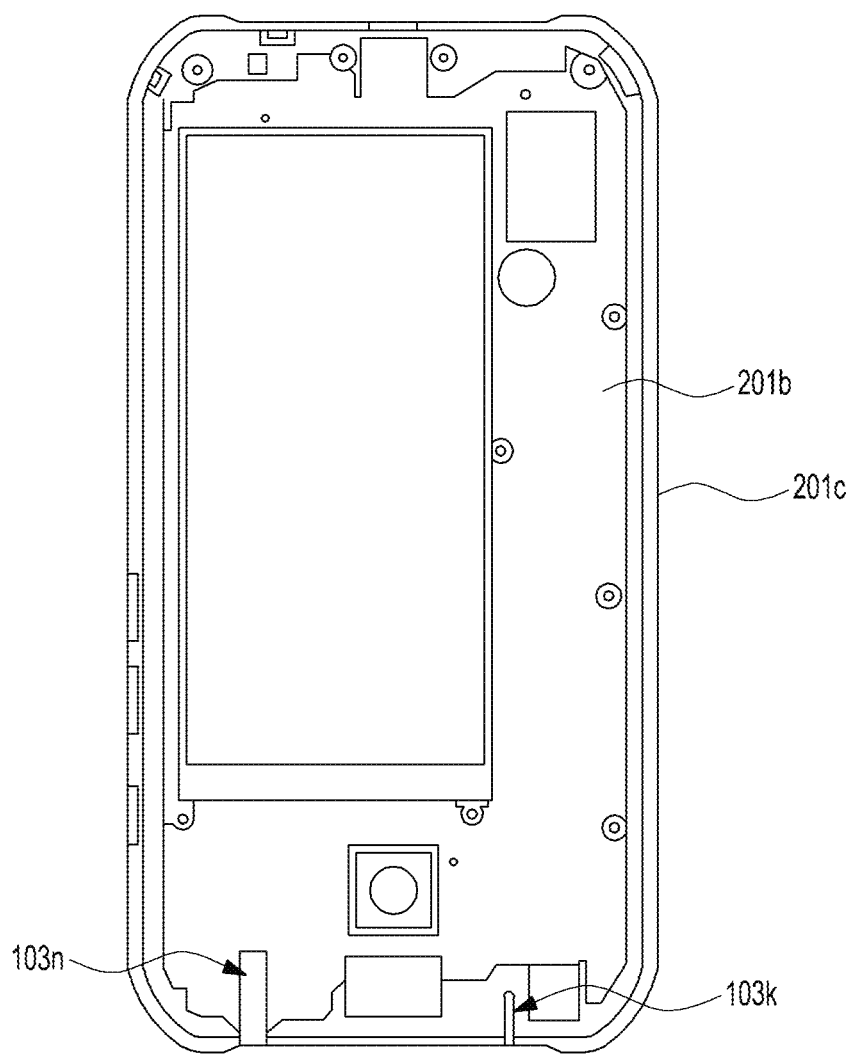
FIG. 5A illustrates a plan view of a channel unit for connection between an opening and circuitry and connection between an opening and the inside of a housing in an electronic device according to various embodiments of the present disclosure.
Figure 5B:
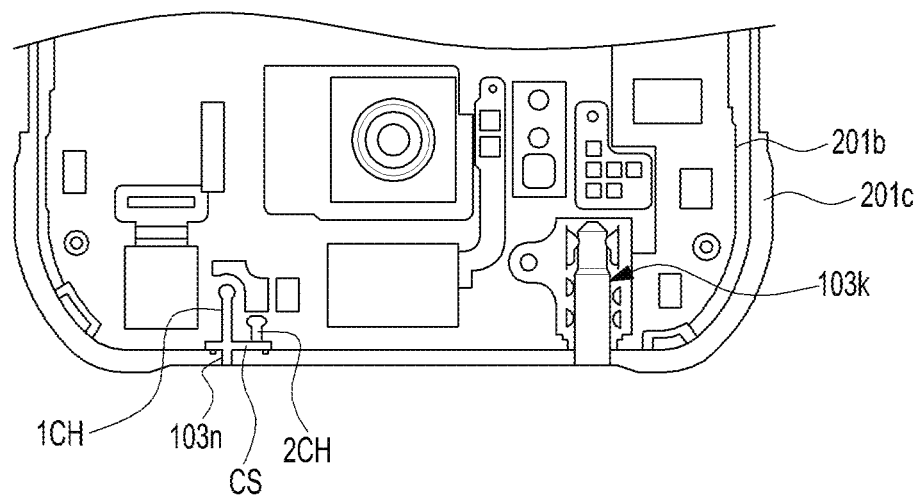
FIG. 5B illustrates a partial plan view of a channel unit for connection between an opening and circuitry and connection between an opening and the inside of a housing in an electronic device according to various embodiments of the present disclosure.
Figure 5C:
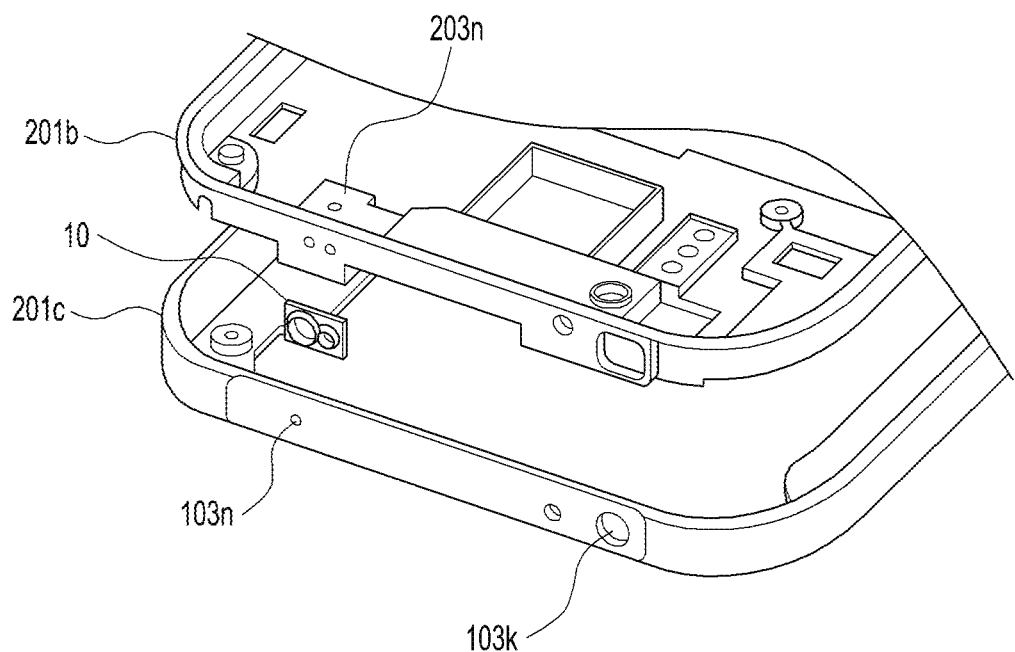
FIG. 5C illustrates a partial perspective view of a channel unit for connection between an opening and circuitry and connection between an opening and the inside of a housing in an electronic device according to various embodiments of the present disclosure.
Figure 5D:
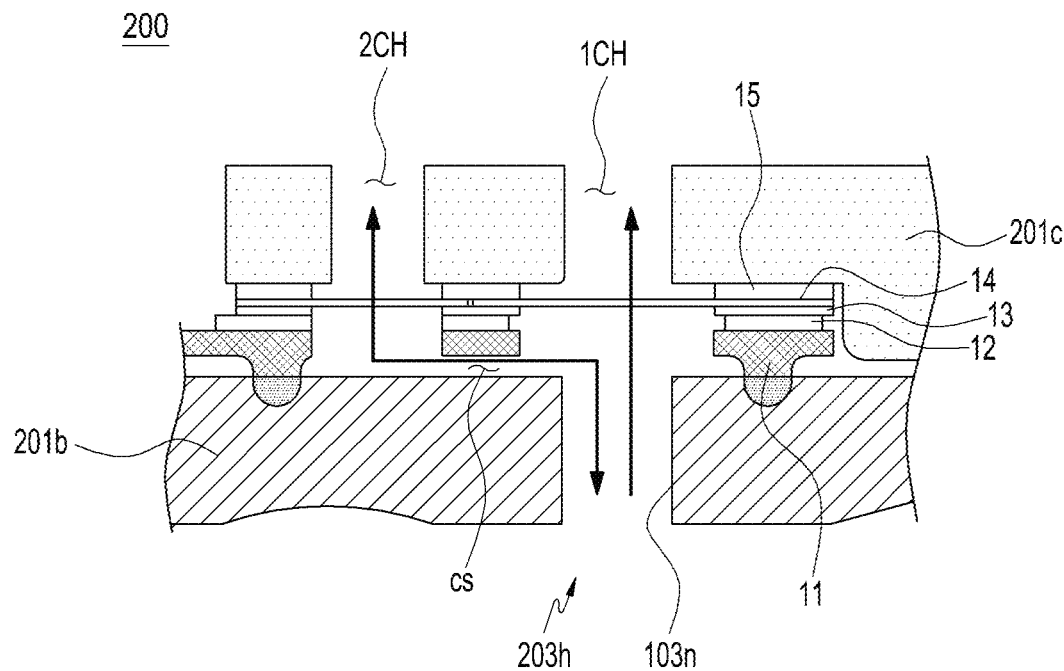
FIG. 5D illustrates a sectional view of a channel unit for connection between an opening and circuitry and connection between an opening and the inside of a housing in an electronic device according to various embodiments of the present disclosure.
Figure 5E:
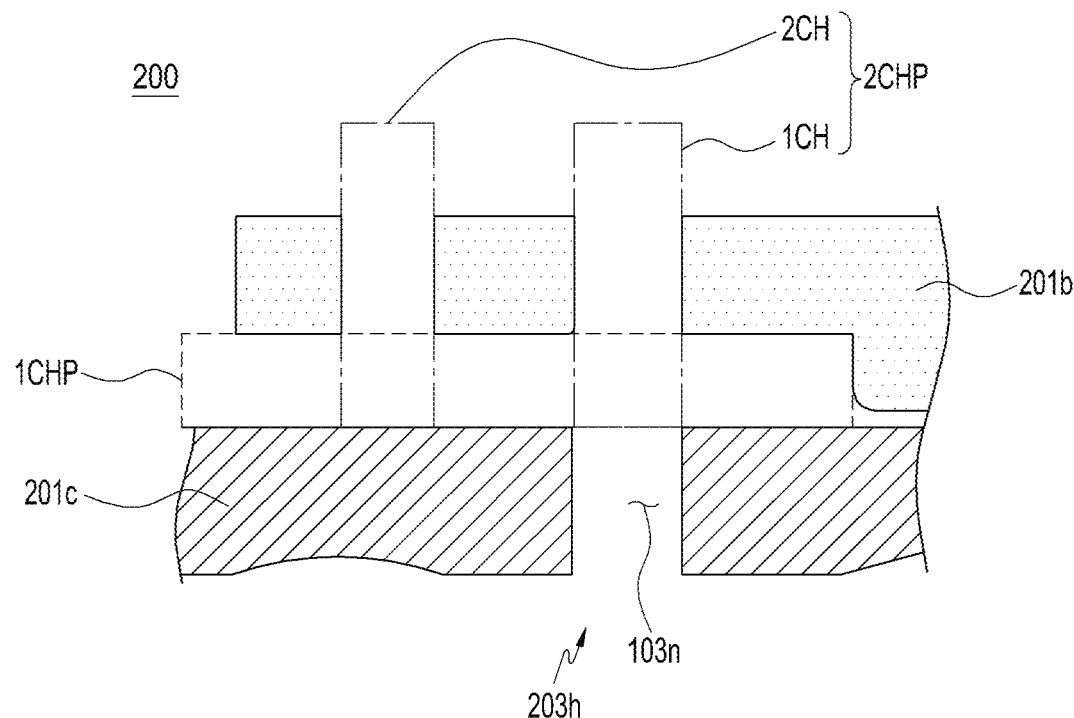
FIG. 5E illustrates a channel unit in an electronic device according to various embodiments of the present disclosure.

FIG. 5A illustrates a plan view of a channel unit for connection between an opening and circuitry and between an opening and the inside of the housing 201 in the electronic device 200 according to various embodiments of the present disclosure. FIG. 5B is a partial plan view of the channel unit for connection between an opening and circuitry and between an opening and the inside of the housing 201 in the electronic device 200 according to various embodiments of the present disclosure. FIG. 5C illustrates a partial perspective view of the channel unit for connection between an opening and circuitry and between an opening and the inside of the housing 201 in the electronic device 200 according to various embodiments of the present disclosure. FIG. 5D illustrates a sectional view of the channel unit for connection between an opening and circuitry and between an opening and the inside of the housing 201 in the electronic device 200 according to various embodiments of the present disclosure. FIG. 5E illustrates the channel unit in the electronic device 200 according to various embodiments of the present disclosure.

Referring to FIGS. 5A to 5E, the housing 201 may include a channel unit through which an opening 103 is connected to circuitry. According to an embodiment, the channel unit may be divided into a first channel part 1CHP and a second channel part 2CHP. The first channel part 1CHP may be provided between the outer housing 201a and 201c and the inner housing 201b.

A part of the first channel part 1CHP may be connected directly to the opening 103, and the other part of the first channel part 1CHP may be connected to the part of the first channel part 1CHP. Depending on the structure of the housing 201, the first channel part 1CHP may or may not be provided between the outer housing 201a and 201c and the inner housing 201b. For example, if only the outer housing 201a and 201c is provided, or the outer housing 201a and 201c is fit with the inner housing 201b, only the later-described second channel part 2CHP may be provided without the first channel part 1CHP.

The second channel part 2CHP may be provided in the inner housing 201b, and connect an opening to the inside of the housing 201. According to an embodiment, the second channel part 2CHP may include a first channel 1CH and a second channel 2CH.

The first channel 1CH connects circuitry mounted inside the inner housing 201b directly to an opening 103. The first channel 1CH may extend from the opening 103 to the circuitry. If the first channel part 1CHP is provided between the inner housing 201b and the outer housing 201a and 201c as in the present disclosure, the first channel 1CH may extend to be connected directly to the opening 103 through the first channel part 1CHP between the outer housing 201a and 201c and the inner housing 201b.

The second channel 2CH is adjacent to the first channel 1CH, and connected to the inner space of the housing 201, in connection to at least a part of the first channel 1CH. For example, if the first channel part 1CHP is provided between the inner housing 201b and the outer housing 201a and 201c as in the present disclosure, the second channel 2CH may, in the vicinity of the first channel 1CH, extend to the opening 103 and to the inner space of the housing 201, through a connection space CS of at least a part of the first channel part 1CHP.

The first channel 1CH may be a channel that connects the opening 103 directly to the circuitry. In the present disclosure, as a part of the first channel part 1CHP is connected directly to the first channel 1CH in the opening 103, the circuitry may be connected to the opening 103a. The second channel 2CH is a channel configured to connect the opening 103 to the inside of the housing 201. Herein, the opening 103 is connected to the inside of the housing 201 through the connection space CS. Therefore, although the second channel 2CH is not seen from the outside, the second channel 2CH is adjacent to the first channel 1CH and connected to the opening 103 and the first channel 1CH through the connection space CS in an internal structure. Thus, according to an embodiment, the channel structure may be shaped into ''.

Figure 6:
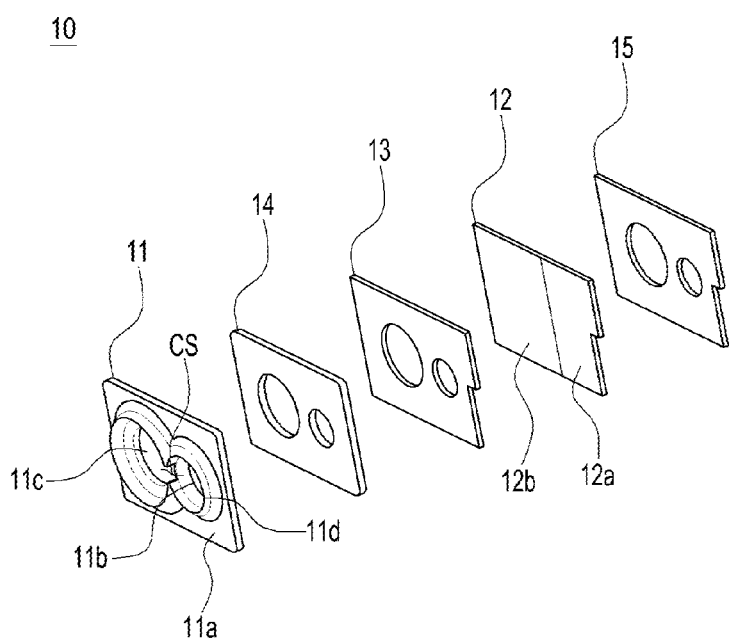
FIG. 6 illustrates an exploded perspective view of a stacked member unit in an electronic device according to various embodiments of the present disclosure.

FIG. 6 illustrates an exploded perspective view of the stacked member unit 10 in the electronic device 200 according to various embodiments of the present disclosure.

According to an embodiment, the stacked member unit 10 may be mounted between the outer housing 201a and 201c and the inner housing 201b, for example, inside the first channel part 1CHP, sealing the first channel part 1CHP and restricting introduction of foreign materials such as water or moisture except for gas into the first channel 1CH and the second channel 2CH.

The stacked member unit 10 may include a sealing member 11 disposed around an opening 103, sealing between the opening 103 and the channel unit, and a foreign-material blocking member 12 for restricting introduction of foreign materials such as water or moisture except for gas into the first channel 1CH and the second channel 2CH. According to an embodiment of the present disclosure, the stacked member unit 10 is configured by stacking a plurality of later-described members between the outer housing 201a and 201c and the inner housing 201b, thus sealing a space between the outer housing 201a and 201c and the inner housing 201b, and restricting introduction of foreign materials such as moisture or dust into the first channel 1CH and the second channel 2CH.

The sealing member 11 is disposed around an opening 103 of the housing 201, thus blocking introduction of foreign materials into the opening 103. For example, the sealing member 11 according to an embodiment of the present disclosure may be disposed in the first channel part 1CHP between the outer housing 201a and 201c and the inner housing 201b inside the opening 103 so as to block introduction of moisture or a foreign material into the opening 103 from the outside of the first channel part 1CHP.

According to an embodiment, the sealing member 11 may include a sealing body 11a, a first hole 11b, a second hole 11c, and a sealing engagement surface 11d.

The sealing body 11a may be mounted to an inner side surface of the housing 201 from the rear surface of the opening 103. The first hole 11b, the second hole 11c, and the sealing engagement surface 11d around the first and second holes 11b and 11c may be formed on the sealing body 11a.

The first hole 11b may be formed on the sealing body 11a in correspondence with the first channel 1CH. Thus, the opening 103 may be connected to the first channel 1CH through the first hole 11b.

The second hole 11c may be formed in the vicinity of the first hole 11b on the sealing body 11a, in correspondence with the second channel 2CH. Thus, the second hole 11c may be connected to the second channel 2CH.

The sealing engagement surface 11d may protrude toward an inner surface of the opening 103, closely contacting the inner side surface of the housing 201. The connection space CS in which the sealing engagement surface 11d is open is formed between the first hole 11b and the second hole 11c. Therefore, when the sealing member 11 is brought into close contact with the inside of the housing 201 from the rear surface of the opening 103, the CS, the second hole 11c, and the second channel 2CH are connected in the opening 103. For example, the sealing engagement surface 11d may be shaped into "" or an oval around the first channel 1CH and the second channel 2CH adjacent to the first channel 1CH, so that the connection space CS may be formed between the first channel 1CH and the second channel 2CH.

The sealing member 11 may be formed of a sealing material with a predetermined elasticity, such as rubber or urethane.

The foreign-material blocking member 12 may be provided inside the sealing member 11, to seal the first channel 1CH and the second channel 2CH between the sealing member 11 and the inner housing 201b, allowing introduction and discharge of air and restricting introduction and discharge of water or moisture.

The foreign-material blocking member 12 may include a first member 12a and a second member 12b.

The first member 12a may be disposed at a position corresponding to the first channel 1CH between the sealing member 11 and the inner housing 201b, to tightly seal circuitry, for example, the audio device 203b, 203n, and 203l. If the circuitry is the audio device 203b, 203n, and 203l, the first member 12a has only to transfer vibrations of sound. Thus, the first member 12a may be formed of a material that restricts introduction and discharge of water or moisture as well as air.

On the other hand, if the circuitry is the camera device 203c, the first member 12a may be formed of a material that allows introduction and discharge of air but restricts introduction and discharge of water or moisture.

The second member 12b may be disposed at a position corresponding to the second channel 2CH between the sealing member 11 and the inner housing 201b, to allow introduction and discharge of air into and from the inside of the housing but restrict introduction and discharge of water or moisture into and from the inside of the housing.

According to an embodiment, the first member 12a and the second member 12b may be formed of the same material.

For example, if the first member 12a is formed of a first material, the second member 12b may also be formed of the same first material. If the first member 12a and the second member 12b are formed of the same material, the first member 12a and the second member 12b may be formed of a material that allows introduction and discharge of air into and from the inside of the first channel 1CH and the second channel 2CH but restricts introduction and discharge of water or moisture into and from the first channel 1CH and the second channel 2CH.

According to an embodiment, the first member 12a and the second member 12b may be formed of different materials.

For example, if the first member 12a is formed of a first material, the second member 12b may be formed of a second material different from the first material. If the first member 12a and the second member 12b are formed of different materials, the first member 12a may be formed of a material that restricts introduction and discharge of air and water or moisture into and from the first channel 1CH, as described before. The second member 12b may be formed of a material that allows introduction and discharge of air into and from the second channel 2CH but restricts introduction and discharge of water or moisture into and from the second channel 2CH.

According to an embodiment, the foreign-material restricting member 12, that is, the first and second members 12a and 12b may be formed of a Gore Tex® material. As mentioned before, if the first and second members 12a and 12b are formed of the same material, the material may be the same Gore Tex® material. On the contrary, if the first and second members 12a and 12b are formed of different materials, the first member 12a may be formed of a first Gore Tex® material and the second member 12b may be formed of a second Gore Tex® material.

Materials for adhesion between the sealing member 11 and the foreign-material blocking member 12 may be provided between the sealing member 11 and the foreign-material blocking member 12. For example, a first adhesion member 14 and a polyethylene terephthalate (PET) member 13 may further be stacked between the sealing member 11 and the foreign-material blocking member 12.

Further, a second adhesion member 15 may be stacked to attach the foreign-material blocking member 12 around the first and second channels 1CH and 2CH.

Therefore, the stacked member unit 10 may include the sealing member 11, the first adhesion member 14, the PET member 13, the foreign-material blocking member 12, and the second adhesion member 15, which are sequentially stacked from the opening 103 toward the inside of the housing 201.

The structure of the stacked member unit 10 or the housing 201 is not limited to the above-described structure. For example, the stacked member unit 10 may be disposed only at the side of the second channel 2CH, or may include only the foreign-material blocking member 12 without the sealing member 11. While it has been described that the housing 201 is formed by engaging the inner housing 201b with the outer housings 201a and 201c, by way of example, various variations and modifications may be made, for example, the outer housings 201a and 201c may be connected directly to circuitry.

Figure 7A:
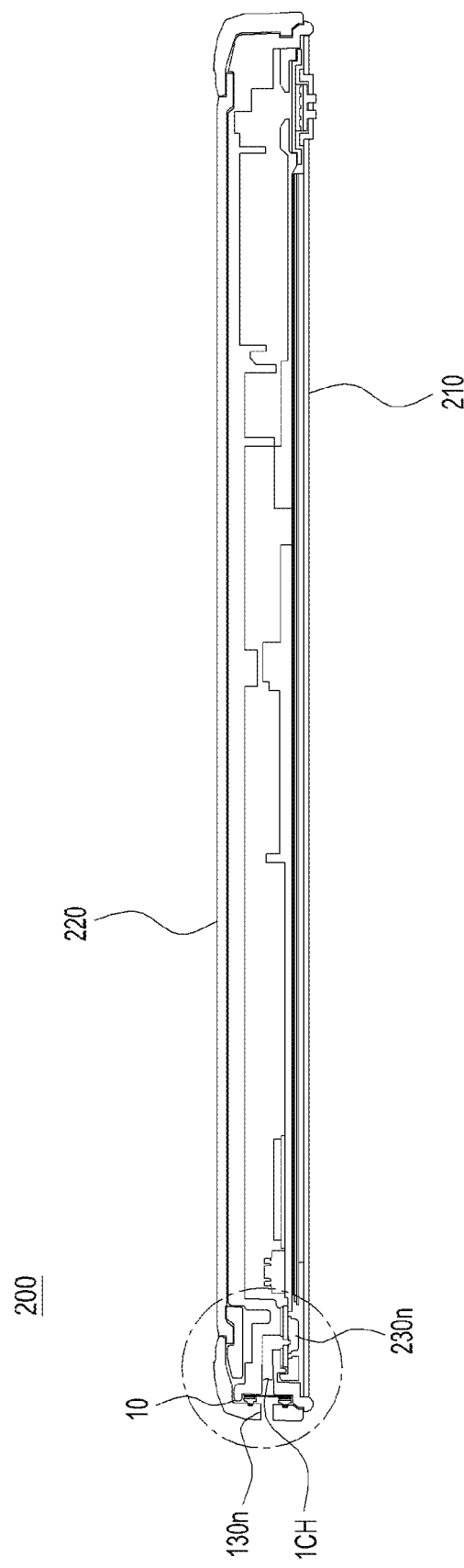
FIG. 7A illustrates a sectional view of an electronic device, illustrating a connection state between an opening and circuitry in the electronic device according to various embodiments of the present disclosure.
Figure 7B:
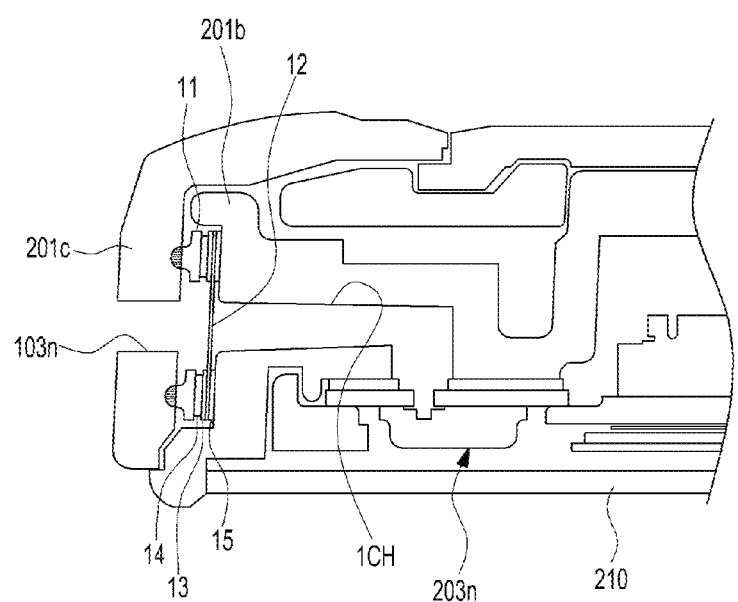
FIG. 7B illustrates a partial enlarged view of a connection state between an opening and circuitry in an electronic device according to various embodiments of the present disclosure.

FIG. 7A illustrates a sectional view of the electronic device 200, illustrating a connection state from an opening 103 to circuitry in the electronic device 200 according to various embodiments of the present disclosure. FIG. 7B illustrates a partial enlarged view of the connection state from the opening 103 to the module in the electronic device 200 according to various embodiments of the present disclosure.

Referring to FIGS. 7A and 7B, as circuitry of the present disclosure is connected to an opening 103 through the first channel 1CH, the circuitry may be connected directly to the outside. That is, the first channel 1CH may be connected directly to the opening 103. The stacked member unit 10 may be disposed between the first channel 1CH and the opening 103, to thereby seal the first channel 1CH and the audio device 203b, 203n, and 203l inside the first channel 1CH. As described before, the stacked member unit 10 may restrict introduction and discharge of air, and water or moisture. Alternatively, the stacked member unit 10 may restrict introduction and discharge of water or moisture, while allowing introduction and discharge of air.

Figure 8A:
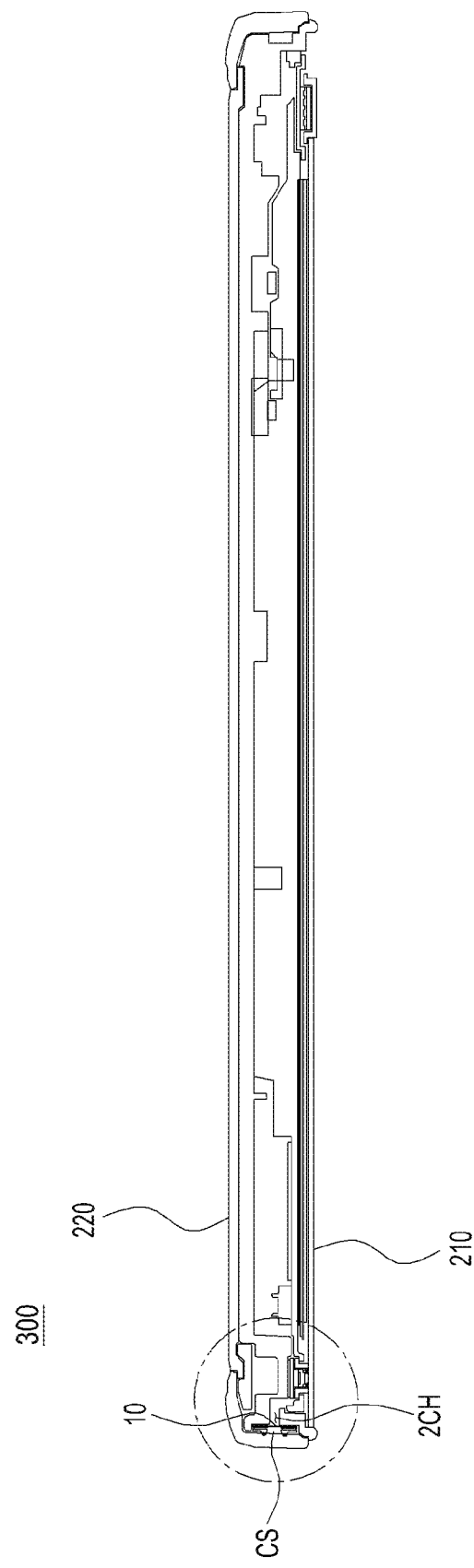
FIG. 8A illustrates a sectional view of an electronic device, illustrating a connection state between an opening and the inside of a housing in the electronic device according to various embodiments of the present disclosure.
Figure 8B:
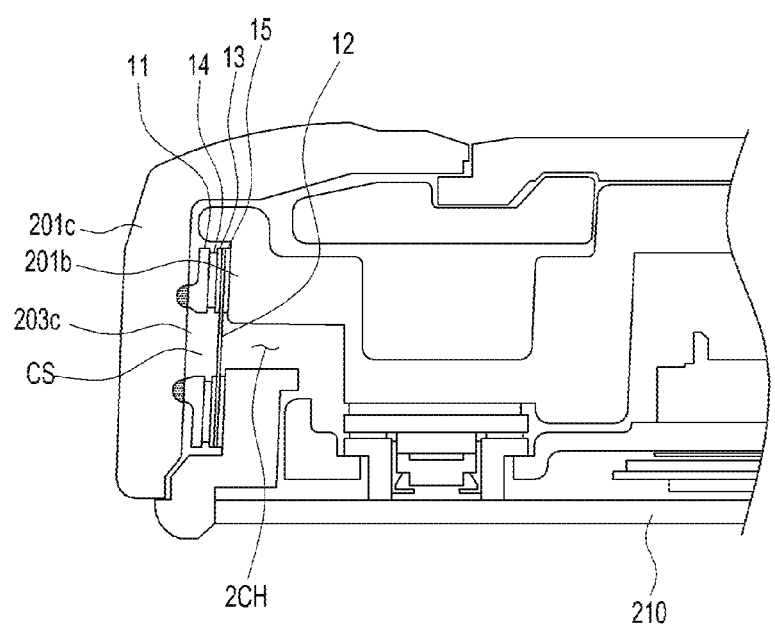
FIG. 8B illustrates a partial enlarged view of a connection state between an opening and the inside of a housing in an electronic device according to various embodiments of the present disclosure.

FIG. 8A illustrates a sectional view of the electronic device 200, illustrating a connection state from an opening 103 to the inside of the housing 201 in the electronic device 200 according to various embodiments of the present disclosure. FIG. 8B illustrates a partial enlarged view of the connection state from the opening 103 to the inside of the housing 201 in the electronic device 200 according to various embodiments of the present disclosure.

Referring to FIGS. 8A and 8B, the inside of the housing 201 may be connected to an opening 103 through the second channel 2CH. In the sectional view, the second channel 2CH may appear to be covered by the housing 201. In other words, the second channel 2CH is not viewable from the outside by a user. However, as the second channel 2CH is connected to the opening 103 through the connection space CS, air may be introduced and discharged to and from the inside of the housing 201.

If the electronic device 200 is waterproof, the outside of the electronic device 200 may be connected to the inside of the housing 201 through the second channel 2CH and the connection space CS. Further, the stacked member unit 10 may be disposed between the second channel 2CH and the inside of the housing 201. Herein, the stacked member unit 10 may be configured to restrict introduction and discharge of water or moisture, while allowing introduction and discharge of air. Thus, air may be introduced and discharged into and from the inside of the housing 201, while introduction and discharge of water or moisture is restricted. As a consequence, the difference between an internal atmospheric pressure and an ambient atmospheric pressure constant in the housing 201 may be maintained constant. That is, the second channel 2CH may function as an air vent.

An opening 103, especially an opening 103 with the second channel 2CH may be applied as openings for other circuitry than the audio device 203b, 203n, and 203l in various embodiments, and these embodiments may be implemented using the afore-described structure, shape, or configuration.

Figure 9A:
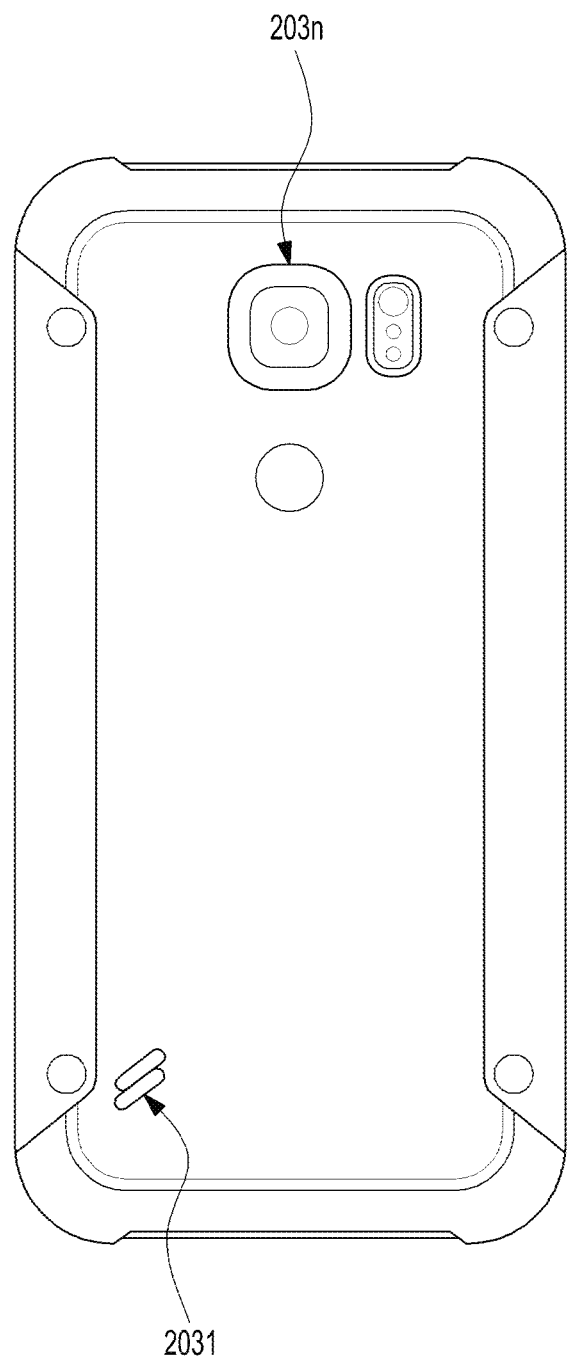
FIG. 9A illustrates a speaker mounted on the rear surface of an electronic device according to various embodiments of the present disclosure.
Figure 9B:
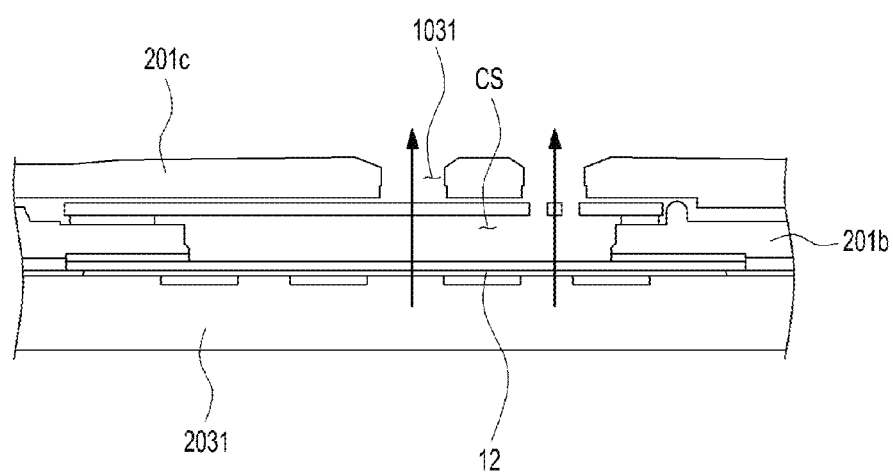
FIG. 9B illustrates a sectional view of connection between the inside and outside of a housing through an opening for a speaker in an electronic device according to various embodiments of the present disclosure.

FIG. 9A illustrates a speaker mounted on the rear surface of the electronic device 200 according to various embodiments of the present disclosure, and FIG. 9B is a sectional view of connection between the inside and outside of the hosing 201 through an opening for a speaker in the electronic device 200 according to various embodiments of the present disclosure.

Referring to FIGS. 9A and 9B, the outer housing 201a and 201c, particularly the outer housing 201a and 201c like a rear case disposed on the rear surface of the electronic device 200 may have an opening 103 that may be connected to the speaker 203l. The opening 103 for the speaker 203l may be a functional opening or functional hole, as described before. That is, the opening 103 for the speaker 203l may be a functional hole for transferring a sound of the speaker 203l mounted inside the inner housing 201b to the outside according to an embodiment of the present disclosure. Thus, the speaker 203l may be configured to be connected directly to the outside through the first channel 1CH and the opening 103.

The stacked member unit 10 may be installed directly on the front surface of the first channel 1CH, that is, on the front surface of the speaker 203l according to an embodiment. For example, with the speaker 203l mounted at the first channel 1CH, the first member 12a may be disposed on the front surface of the speaker 203l, and the sealing member 11, the PET member, and the first adhesion member for engaging them may be stacked on the front surface of the first member 12a. The first member 12a may be formed of a material that restricts introduction and discharge of water or moisture as well as air, or a material that allows introduction and discharge of air but restricts introduction and discharge of water or moisture, thus transferring sounds to the outside and preventing introduction of foreign materials into the first channel 1CH.

Although the second channel 2CH through which the inside of the housing 201 is connected to the outside of the housing 201 is not exposed outward, the second channel 2CH may be connected to the opening 103 through the connection space CS, thus connecting the inside of the inner housing 201b to the outside of the inner housing 201b. The stacked member unit 10 may be disposed on the front surface of the second channel 2CH. Thus, the second channel 2CH may be formed of a material that allows introduction and discharge of air but restricts introduction and discharge of water or moisture. Therefore, as the second channel 2CH is provided using the opening 103 for the speaker 203l in the housing 201, the second channel 2CH may connect the inside of the housing 201 to the outside of the housing 201, without being exposed outward, so as to allow introduction and discharge of air. As a consequence, the internal pressure of the housing 201 may be maintained to be close to the ambient pressure of the housing 201.

Figure 10A:
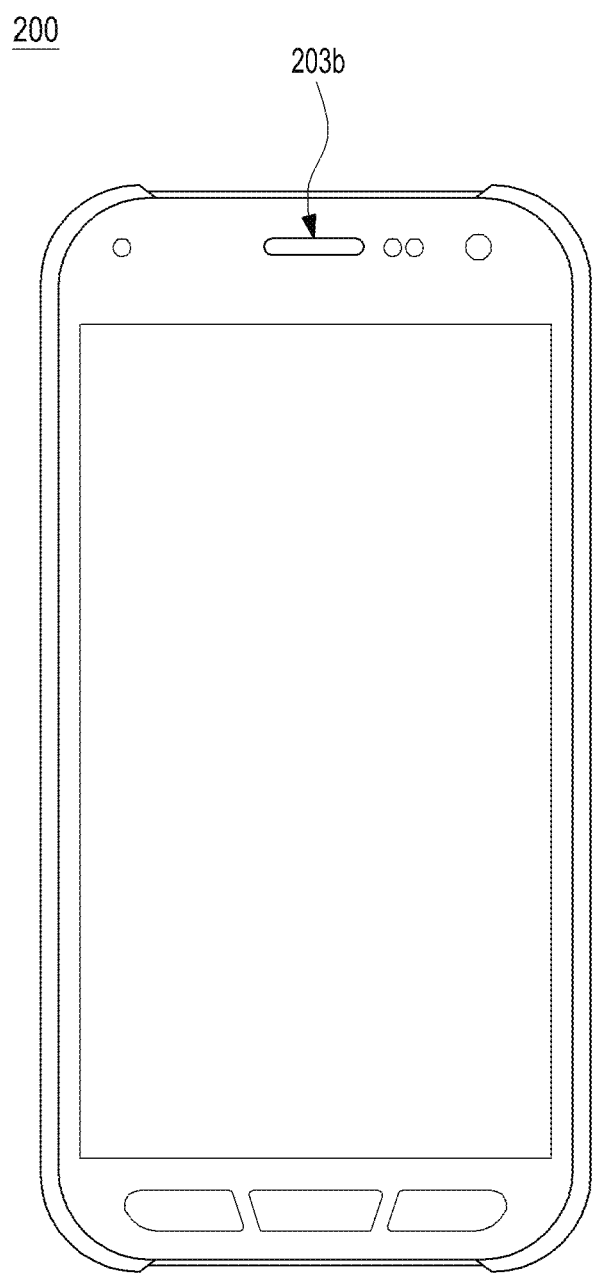
FIG. 10A illustrates a receiver mounted on the front surface of an electronic device according to various embodiments of the present disclosure.
Figure 10B:
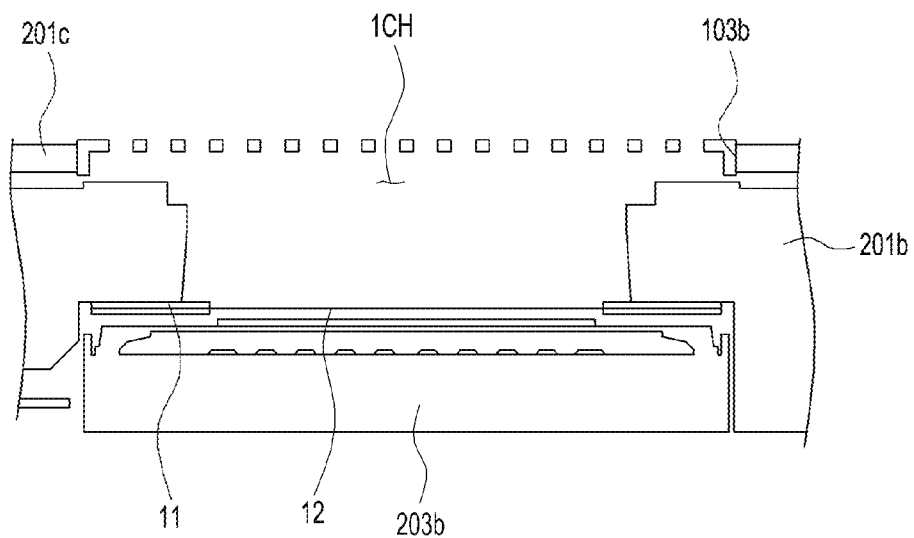
FIG. 10B illustrates a sectional view of connection between the inside and outside of a housing through an opening for a receiver in an electronic device according to various embodiments of the present disclosure.

FIG. 10A illustrates a view illustrating the receiver 203b mounted on the front surface of the electronic device 200 according to various embodiments of the present disclosure, and FIG. 10B is a sectional view of the electronic device 200, illustrating connection between the inside and outside of the housing 201 through the opening 103b for the receiver 203b according to various embodiments of the present disclosure.

Referring to FIGS. 10A and 10B, the receiver 203b for transmitting and receiving sounds may be disposed in the vicinity of the display 210 in the outer housing 201a and 201c, particularly in the electronic device 200, and the opening 103b for connecting the receiver 201b to the outside may be provided in the outer housing 201a such as a front case disposed on the front surface of the electronic device 200. The opening 103b for the receiver 201b may be a functional opening or functional hole. That is, the opening 103b may be a functional hole for transferring sounds from the receiver 203b mounted inside the inner housing 201b to the outside according to an embodiment. Thus, the receiver 203b is configured to be directly connected to the outside through the first channel 1CH and the opening 103b.

The stacked member unit 10 may be installed directly on the front surface of the first channel 1CH, that is, on the front surface of the receiver 203b according to the embodiment. For example, with the receiver 203b mounted at the first channel 1CH, the first member 12a may be disposed on the front surface of the receiver 203b, and the sealing member 11, the PET member, and the first adhesion member for engaging them may be stacked on the front surface of the first member 12a. The first member 12a may be formed of a material that restricts introduction and discharge of water or moisture as well as air, or a material that allows introduction and discharge of air but restricts introduction and discharge of water or moisture, thus transferring sounds to the outside and preventing introduction of foreign materials into the first channel 1CH.

Although the second channel 2CH through which the inside of the housing 201 is connected to the outside of the housing 201 is adjacent to the first channel 1CH and is not exposed outward, the second channel 2CH may be connected to the opening 103b through the connection space CS, thus connecting the inside of the inner housing 201b to the outside of the inner housing 201b. The stacked member unit 10 may be disposed on the front surface of the second channel 2CH. Thus, the second channel 2CH may be formed of a material that allows introduction and discharge of air but restricts introduction and discharge of water or moisture. Therefore, as the second channel 2CH is provided using the opening 103b for the receiver 203b in the housing 201, the second channel 2CH may connect the inside of the housing 201 to the outside of the housing 201 without being exposed outward, so as to allow introduction and discharge of air. As a consequence, the internal pressure of the housing 201 may be maintained to be close to the ambient pressure of the housing 201.

Figure 11:
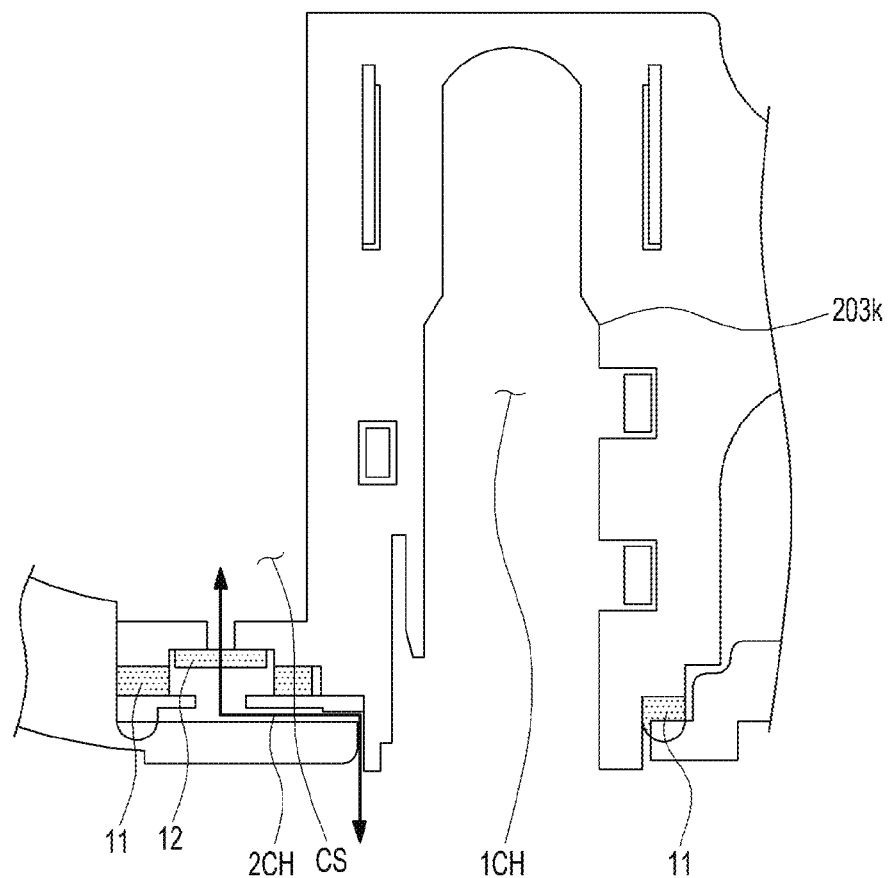
FIG. 11 illustrates a sectional view of an opening for an ear jack device in an electronic device according to various embodiments of the present disclosure.

FIG. 11 illustrates a sectional view of the opening 103k for the ear jack device 203k in the electronic device 200 according to various embodiments of the present disclosure.

Referring to FIG. 11, the ear jack device 203k connected to an external audio device such as an earphone or a speaker may be disposed in the outer housing 201a and 201c, particularly the electronic device 200.

The ear jack device 203k may be connected to the external audio device through the opening 103k formed on a side surface 202c of the outer housing 201a and 201c. The opening 103 for the ear jack device 203k may be a functional opening or functional hole. That is, the opening 103k may be a functional hole through which the ear jack device 203k mounted in the inner housing 201b may be connected to an external device, for example, an ear jack or a speaker jack. Thus, the ear jack device 203k may be mounted directly inside the first channel 1CH connected to the opening 103k, and may be configured to be connected directly to the outside through the opening 103k.

The second channel 2CH that connects the inside and outside of the housing 201 may be connected to the opening 103k through the connection space CS, although the second channel 2CH is not exposed outward, in the vicinity of the first channel 1CH.

The stacked member unit 10 may be installed on the front surfaces of the first and second channels 1CH and 2CH. The stacked member unit 10 may be open at a position corresponding to the first channel 1CH so that the ear jack device 203k inside the first channel 1CH may be connected to an external device. Thus, the stacked member unit 10 may be configured to allow an ear jack to be inserted into the first channel 1CH and restrict introduction and discharge of air and water or moisture into the first channel 1CH.

The second channel 2CH is connected to the opening 103k through the connection space CS. Thus, the stacked member unit 10, specifically the second member 12b may be formed of a material that allows introduction and discharge of air into and from the second channel 2CH but restricts introduction and discharge of water or moisture into and from the second channel 2CH. Therefore, as the second channel 2CH is provided using the opening 103k for the ear jack device 203k in the housing 201, the second channel 2CH may be connected to the opening 103k for the ear jack device 203k without being exposed outward, and connect the inside of the housing 201 to the outside of the housing 201 so as to allow introduction and discharge of air. As a consequence, the internal pressure of the housing 201 may be maintained to be close to the ambient pressure of the housing 201.

Figure 12:
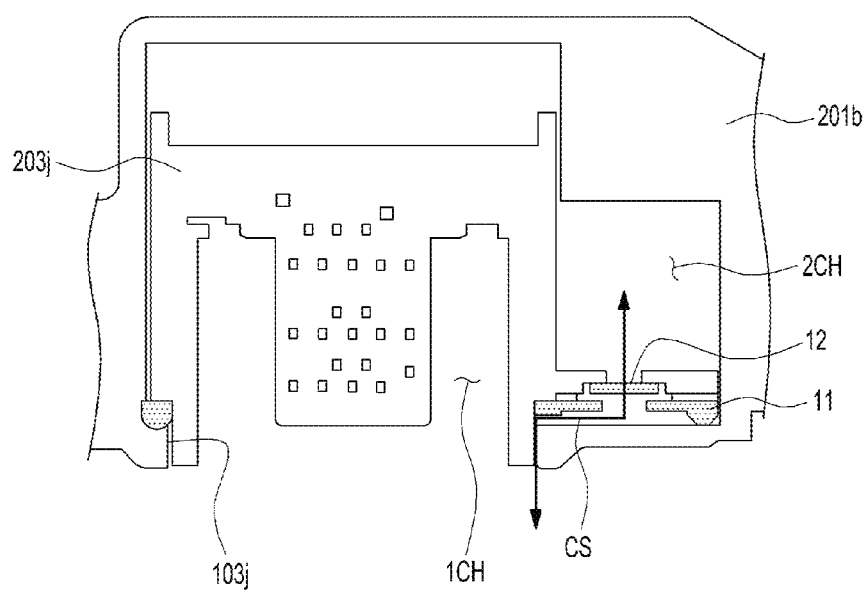
FIG. 12 illustrates a sectional view of an opening for a connector in an electronic device according to various embodiments of the present disclosure.

FIG. 12 illustrates a sectional view of the opening 103j for the connector 203j in the electronic device 200 according to various embodiments of the present disclosure.

Referring to FIG. 12, the connector 203j may be disposed in the outer housing 201a and 201c, particularly in the electronic device 200, for electrical connection to an external port, for example, a charging port, or a port that connects the connector 203j to another electronic device 200.

The connector 203j may be connected through the opening 103j formed on a side surface 202c of the outer housing 201a and 201c. The opening 103j for the connector 203j may be a functional opening or functional hole. That is, the opening 103j may be a functional hole through which the connector 203j mounted in the inner housing 201b may be connected to an external device, for example, a charging port or an external device connection port. The connector 203j may be mounted directly inside the first channel 1CH connected to the opening 103j, and may be configured to be connected directly to an external port inserted into the opening 103j.

Although the second channel 2CH that connects the inside of the housing 201 to the outside of the housing 201 is not exposed outward in the vicinity of the first channel 1CH, the second channel 2CH may be connected to the opening 103j through the connection space CS, thus connecting the inside of the inner housing 201b to the outside of the inner housing 201b.

The stacked member unit 10 may be installed on the front surfaces of the first and second channels 1CH and 2CH. The stacked member unit 10 may be open at a position corresponding to the first channel 1CH so that the connector 203j inside the first channel 1CH may be connected to an external device. Thus, the stacked member unit 10 may be configured to allow an external port to be inserted into the first channel 1CH and restrict introduction and discharge of air and water or moisture into the first channel 1CH.

The second channel 2CH is connected to the opening 103j through the connection space CS. Thus, the stacked member unit 10, specifically the second member 12b may be formed of a material that allows introduction and discharge of air into and from the second channel 2CH but restricts introduction and discharge of water or moisture into and from the second channel 2CH. Therefore, as the second channel 2CH is provided using the opening 103j for the connector 203j in the housing 201, the second channel 2CH may be connected to the connector 203j through the opening 103j, and connect the inside of the housing 201 to the outside of the housing 201 without being exposed outward so as to allow introduction and discharge of air. As a consequence, the internal pressure of the housing 201 may be maintained to be close to the ambient pressure of the housing 201.

Figure 13A:
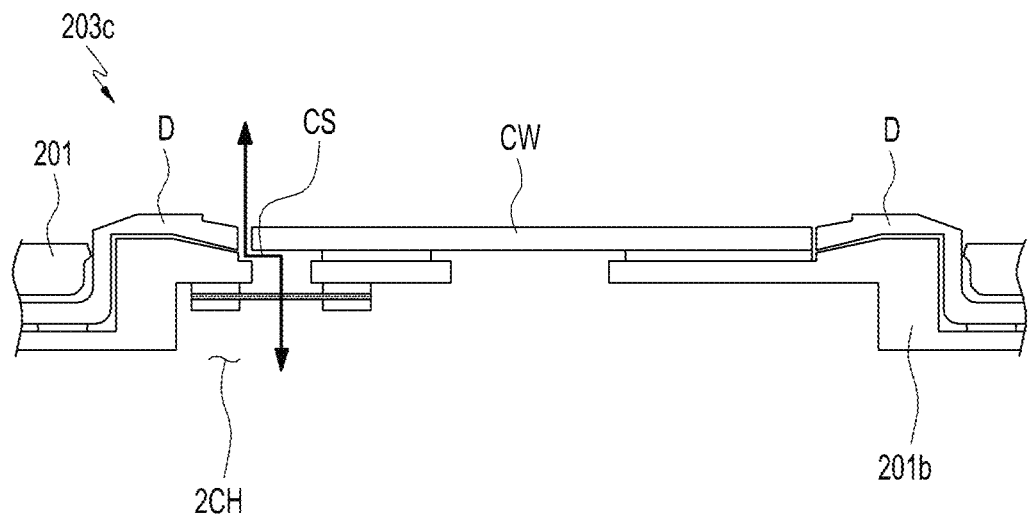
FIG. 13A illustrates a sectional view of an opening for a camera in an electronic device according to various embodiments of the present disclosure.
Figure 13B:
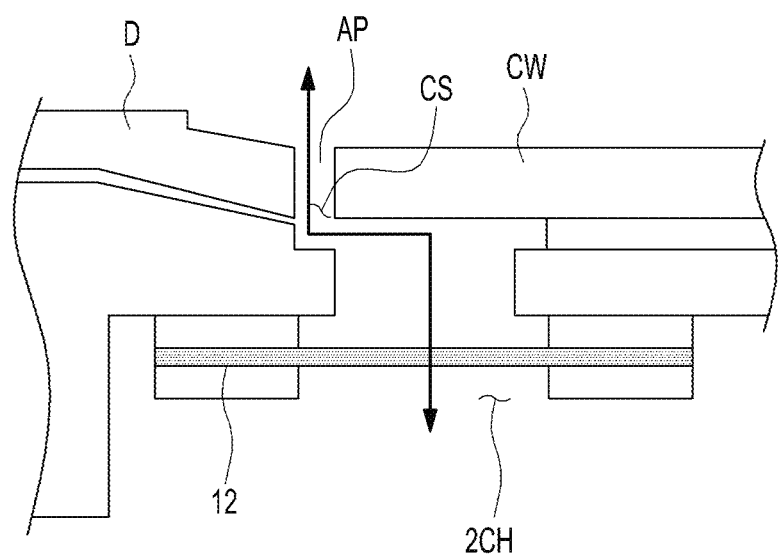
FIG. 13B illustrates an enlarged sectional view of a second channel in an opening for a camera in an electronic device according to various embodiments of the present disclosure.

FIG. 13A illustrates a sectional view of the opening 103c for the camera device 203c in the electronic device 200 according to various embodiments of the present disclosure, and FIG. 13B is an enlarged sectional view of the second channel 2CH in the opening 103c for the camera device 203c in the electronic device 200 according to various embodiments of the present disclosure.

Referring to FIGS. 13A and 13B, the opening 103c or mounting the camera device 203c in it may be provided in the outer housing 201a and 201c, particularly the electronic device 200. The camera device 203c may be mounted in the opening 103c, directly exposed from the opening 103c to capture an external object. The opening 103c for the camera device 203c may be a shape-matching opening or shape-matching hole. Thus, the camera device 203c may be mounted directly in the opening 103c. A camera window CW may be provided in the opening 103c so that the camera device 203c may be directly exposed outward.

The camera device 203c may be mounted in the first channel 1CH inward from the opening 103c, and the transparent camera window CW for covering the camera device 203c may cover the opening 103c. Therefore, when the camera device 203c, specifically the camera window CW is mounted in the opening 103c, the second channel 2CH may be connected to the camera device 203c using a gap between the camera window CW and the opening 103k. Therefore, as the second channel 2CH is provided using the opening 103c for the camera device 203c in the housing 201, the second channel 2CH may be connected to the camera device 203c through the opening 103c, and connect the inside of the housing 201 to the outside of the housing 201 without being exposed outward, so as to allow introduction and discharge of air. As a consequence, the internal pressure of the housing 201 may be maintained to be close to the ambient pressure of the housing 201.

Further, the stacked member unit 10 may be disposed on the front surface of the second channel 2CH connected to the inside of the housing 201 using the gap between the camera window CW and the opening 103c. The stacked member unit 10 may be formed of a material that allows introduction and discharge of air into and from the second channel 2CH but restricts introduction and discharge of water or moisture into and from the second channel 2CH. For example, the stacked member unit 10 according to the embodiment may include the sealing member 11 and the second member 12b on the front surface of the second channel 2CH. Therefore, although the inside and outside of the housing 201 are connected so that air may be introduced and discharged between the inside and outside of the housing 201 using the gap and the second channel 2CH, introduction and discharge of foreign materials such as moisture or dust may be restricted. Therefore, as the second channel 2CH is provided using the opening 103c for the camera device 203c in the housing 201, the second channel 2CH may be connected to the camera device 203c through the opening 103c, and connect the inside of the housing 201 to the outside of the housing 201 without being exposed outward, so as to allow introduction and discharge of air. As a consequence, the internal pressure of the housing 201 may be maintained to be close to the ambient pressure of the housing 201.

Figure 14:
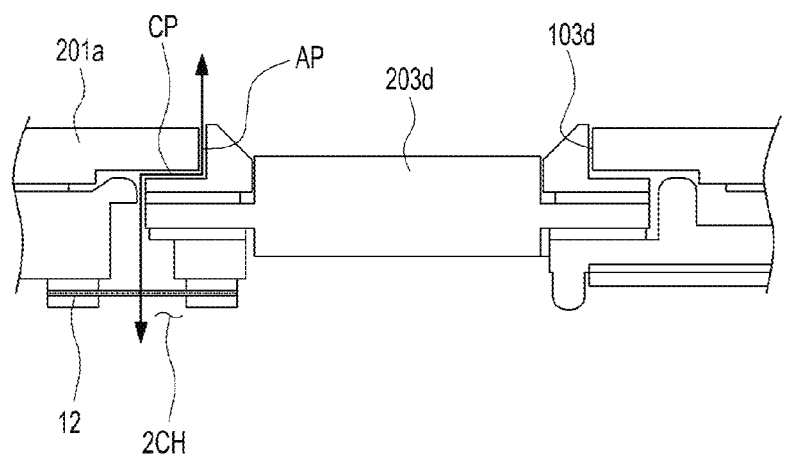
FIG. 14 illustrates a sectional view of an opening for an illuminator in an electronic device according to various embodiments of the present disclosure.

FIG. 14 illustrates a sectional view of the opening 103d for the illuminator 203d in the electronic device 200 according to various embodiments of the present disclosure.

Referring to FIG. 14, the opening 103d for mounting the illuminator 203d such as the service light 203d may be provided in the outer housing 201a and 201c, particularly in the electronic device 200. The illuminator 203d may be mounted directly inside the opening 103d so that light emitted from the illuminator 203d mounted in the housing 201 may be viewed from the outside. The opening 103d for the illuminator 203d may be a shape-matching opening or shape-matching hole. Thus, the illuminator 203d may be mounted directly inside the opening 103d. In the case of the illuminator 203d, a decoration may be provided between the opening 103d and the illuminator 203d to mount the illuminator 203d and render the design sophisticated.

The illuminator 203d may be mounted in the first channel 1CH inward from the opening 103d, between the opening 103d and the decoration. When the illuminator 203d is mounted in the opening 103d, specifically with respect to the decoration, the second channel 2CH may be connected to the illuminator 203d using a gap between the decoration and the opening 103d. Therefore, the second channel 2CH may be connected to the outside of the housing 201 using the opening 103d for the illuminator 203d in the housing 201, that is, using a gap generated when the illuminator 203d is mounted in the opening 103d. As the second channel 2CH is connected to the opening 103d for the illuminator 203d, the second channel 2CH may connect the inside of the housing 201 to the outside of the housing 201 without being exposed so as to allow introduction and discharge of air. As a consequence, the internal pressure of the housing 201 may be maintained to be close to the ambient pressure of the housing 201.

The stacked member unit 10 may be disposed between the opening 103d and the second channel 2CH with a gap in between. The stacked member unit 10 may be formed of a material that allows introduction and discharge of air to and from the second channel 2CH but restricts introduction and discharge of water or moisture to and from the second channel 2CH. For example, the stacked member unit 10 according to the embodiment may include the sealing member 11 and the second member 12b on the front surface of the second channel 2CH. Therefore, although the inside and outside of the housing 201 are connected to each other through the gap and the second channel 2CH so that air may be introduced and discharged, introduction and discharge of a foreign material such as moisture or dust may be restricted. Therefore, as the second channel 2CH is provided using the opening 103d for the illuminator 203d in the housing 201, the second channel 2CH may connect the inside of the housing 201 to the outside of the housing 201 without being exposed outward, so as to allow introduction and discharge of air. As a consequence, the internal pressure of the housing 201 may be maintained to be close to the ambient pressure of the housing 201.

Figure 15:
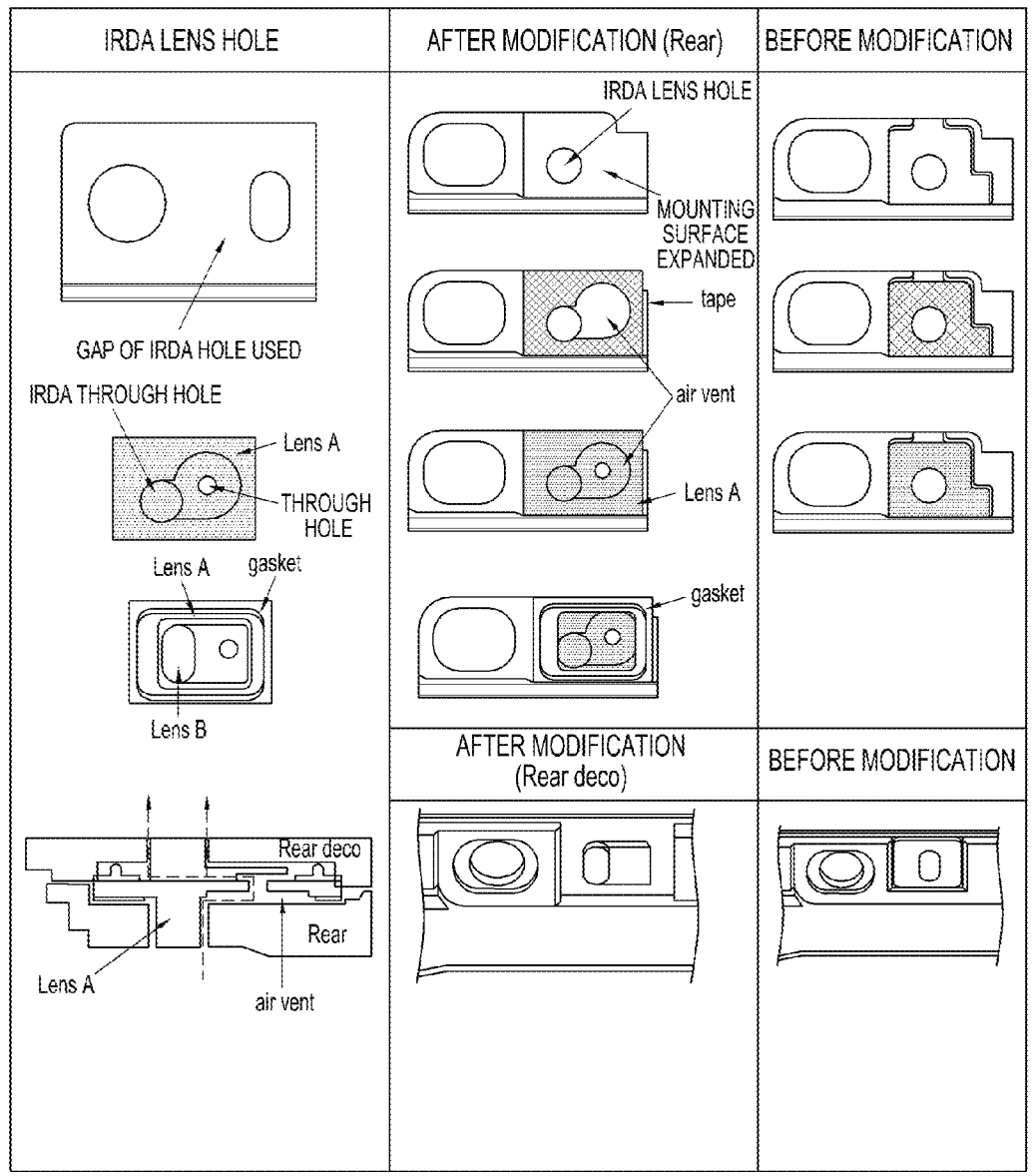
FIG. 15 illustrates an opening for an infrared data association (IrDA) device in an electronic device according to various embodiments of the present disclosure.

FIG. 15 illustrates an opening 103 for an IrDA device in the electronic device 200 according to various embodiments of the present disclosure.

Referring to FIG. 15, the opening 103 for mounting the IrDA device may be provided in the outer housing 201a and 201c, particularly in the electronic device 200, in order to enable infrared communication. The IrDA device may be mounted directly inside the opening 103 so as to enable infrared transmission and reception to and from an external device. The opening 103 for the IrDA device may be a shape-matching opening or shape-matching hole. Thus, the IrDA illuminator 203d may be mounted directly inside the opening 103.

A gap may be generated between the opening 103d and the IrDA illuminator 203d, when the IrDA illuminator 203d is mounted in the opening 103d, and the second channel 2CH may be connected to the IrDA illuminator 203d through the gap. Therefore, the second channel 2CH may be connected to the outside of the housing 201 using the opening 103d for the IrDA illuminator 203d in the housing 201, that is, using a gap generated when the IrDA illuminator 203d is mounted in the opening 103d.

The stacked member unit 10 may be disposed between the opening 103 and the second channel 2CH with a gap in between. The stacked member unit 10 may be formed of a material that allows introduction and discharge of air to and from the second channel 2CH but restricts introduction and discharge of water or moisture to and from the second channel 2CH. For example, the stacked member unit 10 according to the embodiment may include the sealing member 11 and the second member 12b on the front surface of the second channel 2CH. Therefore, although the inside and outside of the housing 201 are connected to each other through the gap and the second channel 2CH so that air may be introduced and discharged, introduction and discharge of a foreign material such as moisture or dust may be restricted. Therefore, as the second channel 2CH is provided using the opening 103 for the IrDA illuminator 203d in the housing 201, the second channel 2CH may connect the inside of the housing 201 to the outside of the housing 201 without being exposed outward, so as to allow introduction and discharge of air. As a consequence, the internal pressure of the housing 201 may be maintained to be close to the ambient pressure of the housing 201.

With reference to the attached drawings, an electronic device according to various embodiments will be described below. According to various embodiments of the present disclosure, the term 'user' may refer to a person or device (for example, artificial intelligence electronic device) that uses an electronic device.

Figure 16:
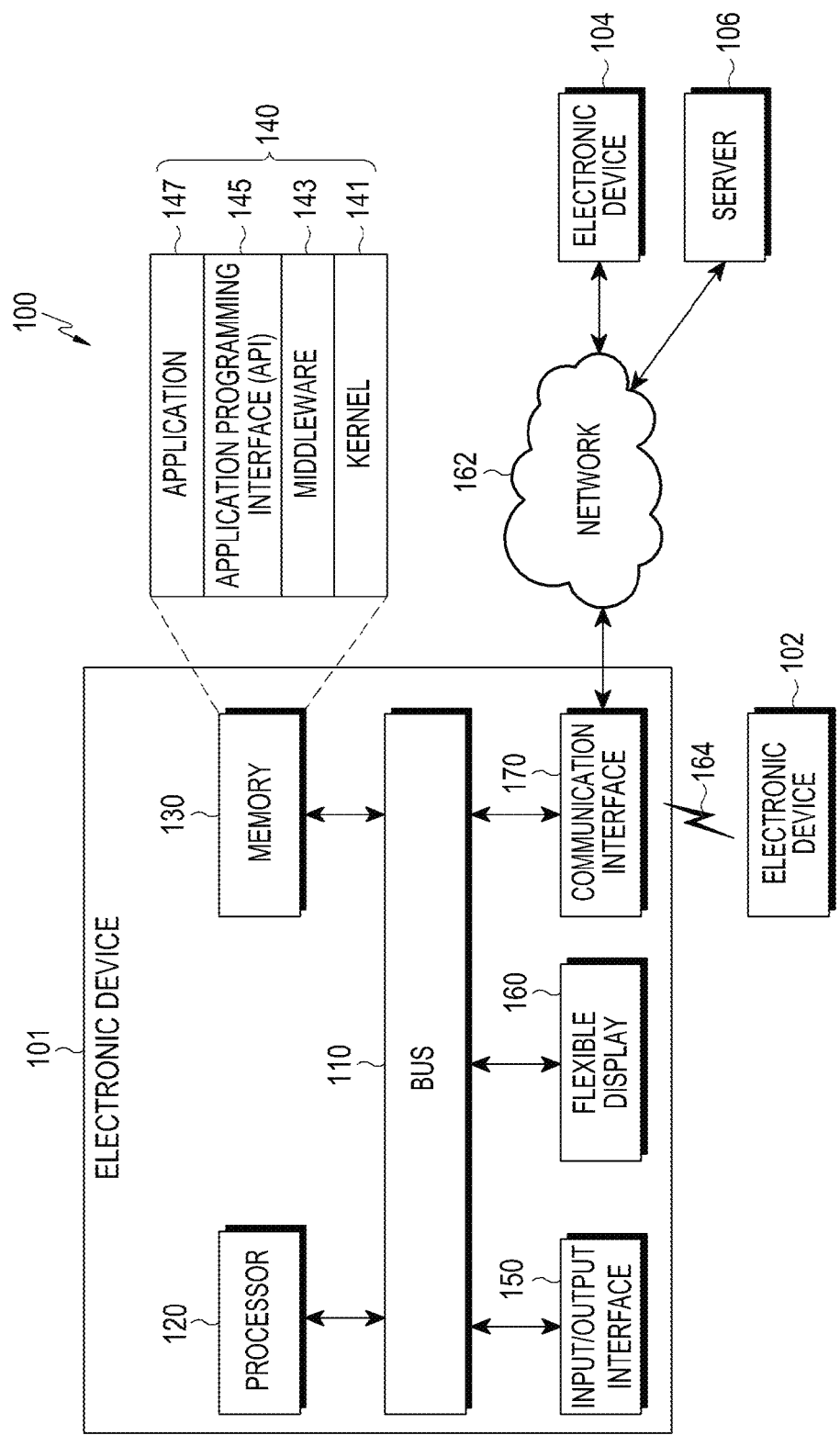
FIG. 16 illustrates a block diagram of a network environment including an electronic device according to various embodiments of the present disclosure.

FIG. 16 illustrates a view illustrating a network environment 100 including an electronic device 101 according to various embodiments of the present disclosure.

Referring to FIG. 16, the electronic device 101 may include a bus 110, a processor 120, a memory 130, an input/output (I/O) interface 150, a display 160, and a communication interface 170. In some embodiments, at least one of the components may be omitted in the electronic device 101 or a component may be added to the electronic device 101.

The bus 110 may include a circuit that interconnects the foregoing components 120, 130, 150, 160, and 170 and allows communication (for example, control messages and/or data) between the foregoing components.

The processor 120 may include one or more of a CPU, an AP, or a communication processor (CP). The processor 120 may, for example, execute computation or data processing related to control and/or communication of at least one other component of the electronic device 101.

The memory 130 may include a volatile memory and/or a non-volatile memory. The memory 130 may, for example, store instructions or data related to at least one other component. According to an embodiment, the memory 130 may store software and/or programs 140. The programs 140 may include, for example, a kernel 141, middleware 143, an application programming interface (API) 145, and/or application programs (or applications) 147. At least a part of the kernel 141, the middleware 143, and the API, 145 may be called an operating system (OS).

The kernel 141 may control or manage system resources (for example, the bus 110, the processor 120, or the memory 130) that are used in executing operations or functions implemented in other programs such as the middleware 143, the API 145, or the application programs 147. Also, the kernel 141 may provide an interface for allowing the middleware 143, the API 145, or the application programs 147 to access individual components of the electronic device 101 and control or manage system resources.

The middleware 143 may serve as a medium through which the kernel 141 may communicate with, for example, the API 145 or the application programs 147 to transmit and receive data.

Also, the middleware 143 may process one or more task requests received from the application programs 147 according to their priority levels. For example, the middleware 143 may assign priority levels for using system resources (the bus 110, the processor 120, or the memory 130) of the electronic device 101 to at least one of the application programs 147. For example, the middleware 143 may perform scheduling or load balancing for the one or more task requests by processing the one or more task requests according to the priority levels.

The API 145 is an interface that may control functions that the application programs 147 provide at the kernel 141 or the middleware 143. For example, the API 145 may include at least one interface or function (for example, a command) for file control, window control, video processing, or text control.

The I/O interface 150 may, for example, provide a command or data received from a user or an external device to the other component(s) of the electronic device 101. Further, the I/O interface 150 may output a command or data received from the other component(s) of the electronic device 101 to the user or the external device.

The display 160 may include, for example, a liquid crystal display (LCD), a light emitting diode (LED) display, an organic LED (OLED) display, a microelectromechanical systems (MEMS) display, or an electronic paper display. The display 160 may display, for example, various types of content (for example, text, an image, a video, an icon, and/or a symbol) to the user. The display 160 may include a touch screen and receive, for example, a touch input, a gesture input, a proximity input, or a hovering input through an electronic pen or a user's body part.

The communication interface 170 may establish communication, for example, between the electronic device 101 and an external device (for example, a first external electronic device 102, a second external electronic device 104, or a server 106). For example, the communication interface 170 may be connected to a network 162 by wireless communication or wired communication and communicate with the external device (for example, the second external electronic device 104 or the server 106) over the network 162.

Each of the first and second external electronic devices 102 and 104 may be of the same type as or a different type from the electronic device 101. According to an embodiment, the service 106 may be a group of one or more servers. According to various embodiments, all or a part of operations performed in the electronic device 101 may be performed in one or more other electronic devices (for example, the electronic devices 102 and 104) or the server 106. According to an embodiment, if the electronic device 101 is to perform a function or a service automatically or upon request, the electronic device 101 may request at least a part of functions related to the function or the service to another device (for example, the electronic device 102 or 104 or the server 106), instead of performing the function or the service autonomously, or additionally. The other electronic device (for example, the electronic device 102 or 104 or the server 106) may execute the requested function or an additional function and provide a result of the function execution to the electronic device 101. The electronic device 101 may provide the requested function or service based on the received result or by additionally processing the received result. For this purpose, for example, cloud computing, distributed computing, or client-server computing may be used.

Figure 17:
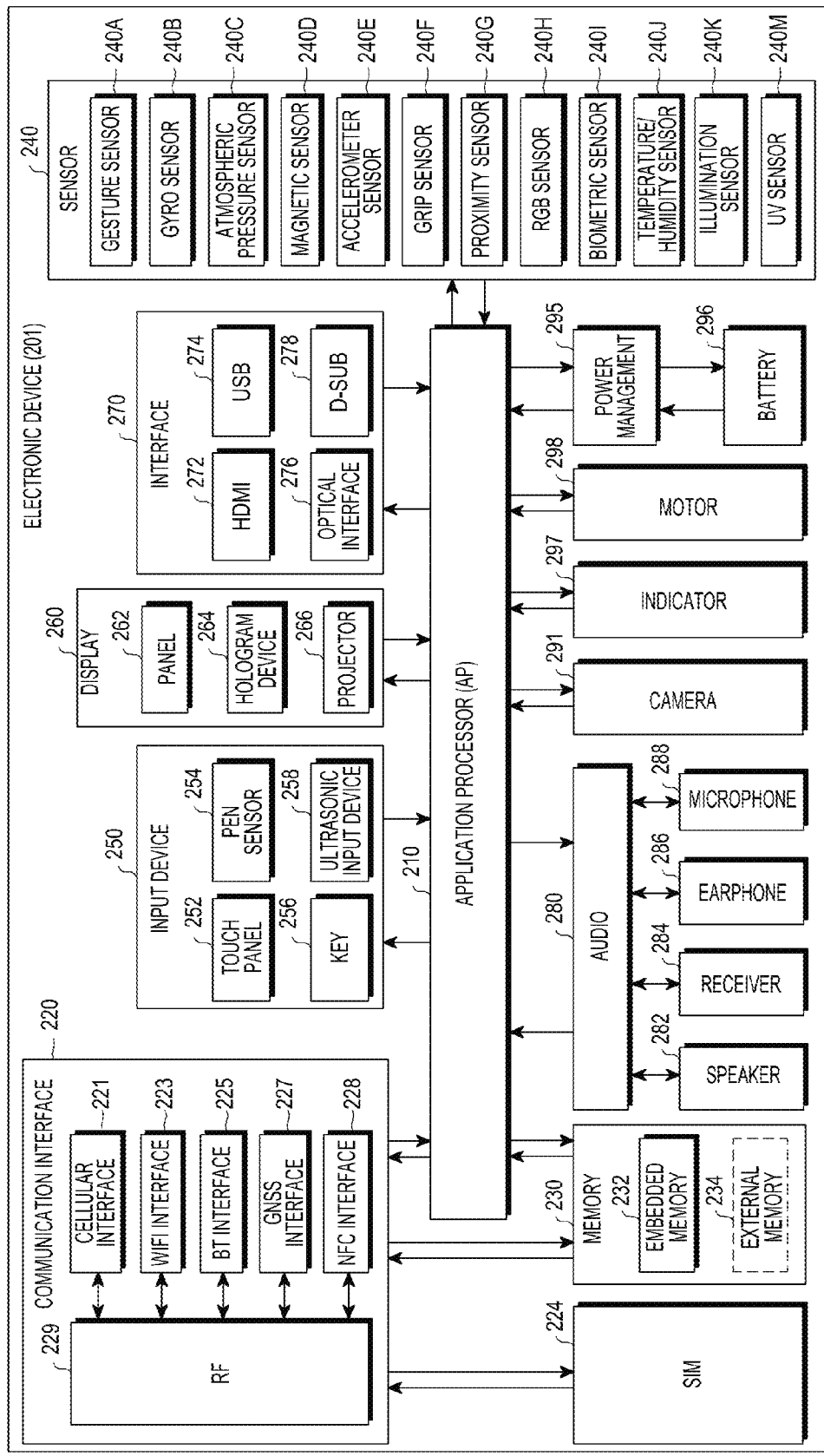
FIG. 17 illustrates a block diagram of an electronic device according to various embodiments of the present disclosure.

FIG. 17 illustrates a block diagram of an electronic device 201 according to various embodiments.

Referring to FIG. 17, the electronic device 201 may include, for example, the whole or part of the electronic device 101 illustrated in FIG. 16. The electronic device 201 may include at least one processor (for example, AP) 210, a communication interface 220, a subscriber identification module (SIB) 224, a memory 230, a sensor 240, an input device 250, a display 260, an interface 270, an audio 280, a camera 291, a power management 295, a battery 296, an indicator 297, and a motor 298.

The processor 210 may, for example, control a plurality of hardware or software components that are connected to the processor 210 by executing an OS or an application program and may perform processing or computation of various types of data. The processor 210 may be implemented, for example, as a system on chip (SoC). According to an embodiment, the processor 210 may further include a graphics processing unit (GPU) and/or an image signal processor. The processor 210 may include at least a part (for example, a cellular interface 221) of the components illustrated in FIG. 17. The processor 210 may load a command or data received from at least one of other components (for example, a non-volatile memory), process the loaded command or data, and store various types of data in the non-volatile memory.

The communication interface 220 may have the same configuration as or a similar configuration to the communication interface 170 illustrated in FIG. 16. The communication interface 220 may include, for example, the cellular interface 221, a wireless fidelity (WiFi) interface 223, a Bluetooth (BT) interface 225, a global navigation satellite system (GNSS) interface 227 (for example, a global positioning system (GPS) interface, a Glonass interface, a Beidou interface, or a Galileo interface), a near field communication (NFC) interface 228, and a radio frequency (RF) 229.

The cellular interface 221 may provide services such as voice call, video call, text service, or the Internet service, for example, through a communication network. According to an embodiment, the cellular interface 221 may identify and authenticate the electronic device 201 within a communication network, using the SIM (for example, a SIM card) 224. According to an embodiment, the cellular interface 221 may perform at least a part of the functionalities of the processor 210. According to an embodiment, the cellular interface 221 may include a CP.

Each of the WiFi interface 223, the BT interface 225, the GNSS interface 227, and the NFC interface 228 may include, for example, a processor that processes data received or transmitted by the interface. According to an embodiment, at least a part (for example, two or more) of the cellular interface 221, the WiFi interface 223, the BT interface 225, the GNSS interface 227, or the NFC interface 228 may be included in a single integrated chip (IC) or IC package.

The RF 229 may transmit and receive, for example, communication signals (for example, RF signals). The RF 229 may include, for example, a transceiver, a power amplifier module (PAM), a frequency filter, a low noise amplifier (LNA), an antenna, or the like. According to another embodiment, at least one of the cellular interface 221, the WiFi interface 223, the BT interface 225, the GNSS interface 227, or the NFC interface 228 may transmit and receive RF signals via a separate RF.

The SIM 224 may include, for example, a card including the SIM and/or an embedded SIM. The SIM 224 may include a unique identifier (for example, integrated circuit card identifier (ICCID)) or subscriber information (for example, international mobile subscriber identity (IMSI)).

The memory 230 (for example, the memory 130) may include, for example, an internal memory 232 or an external memory 234. The internal memory 232 may be at least one of, for example, a volatile memory (for example, dynamic RAM (DRAM), static RAM (SRAM), or synchronous dynamic RAM (SDRAM)), and a non-volatile memory (for example, one time programmable ROM (OTPROM), programmable ROM (PROM), erasable and programmable ROM (EPROM), electrically erasable and programmable ROM (EEPROM), mask ROM, flash ROM, flash memory (for example, NAND flash memory, or NOR flash memory), a hard drive, and a solid state drive (SSD).

The external memory 234 may further include a flash drive such as a compact flash (CF) drive, a secure digital (SD), a micro secure digital (micro-SD), a mini secure digital (mini-SD), an extreme digital (xD), a multi-media card (MMC), or a memory stick. The external memory 234 may be operatively and/or physically coupled to the electronic device 201 via various interfaces.

The sensor 240 may, for example, measure physical quantities or detect operational states of the electronic device 201, and convert the measured or detected information into electric signals. The sensor 240 may include at least one of, for example, a gesture sensor 240A, a gyro sensor 240B, an atmospheric pressure sensor 240C, a magnetic sensor 240D, an accelerometer sensor 240E, a grip sensor 240F, a proximity sensor 240G, a color sensor (for example, a red, green, blue (RGB) sensor) 240H, a biometric sensor 2401, a temperature/humidity sensor 240J, an illumination sensor 240K, or an ultra violet (UV) sensor 240M. Additionally or alternatively, the sensor 240 may include, for example, an electrical-nose (E-nose) sensor, an electromyogram (EMG) sensor, an electroencephalogram (EEG) sensor, an electrocardiogram (ECG) sensor, an infrared (IR) sensor, an iris sensor, and/or a finger print sensor. The sensor 240 may further include a control circuit for controlling one or more sensors included therein. According to some embodiments, the electronic device 201 may further include a processor configured to control the sensor 240, as a part of or separately from the processor 210. Thus, while the processor 210 is in a sleep state, the control circuit may control the sensor 240.

The input device 250 may include, for example, a touch panel 252, a (digital) pen sensor 254, a key 256, or an ultrasonic input device 258. The touch panel 252 may operate in at least one of, for example, capacitive, resistive, infrared, and ultrasonic schemes. The touch panel 252 may further include a control circuit. The touch panel 252 may further include a tactile layer to thereby provide haptic feedback to the user.

The (digital) pen sensor 254 may include, for example, a detection sheet which is a part of the touch panel or separately configured from the touch panel. The key 256 may include, for example, a physical button, an optical key, or a keypad. The ultrasonic input device 258 may sense ultrasonic signals generated by an input tool using a microphone (for example, a microphone 288), and identify data corresponding to the sensed ultrasonic signals.

The display 260 (for example, the display 160) may include a panel 262, a hologram device 264, or a projector 266. The panel 262 may have the same configuration as or a similar configuration to the display 160 illustrated in FIG. 16. The panel 262 may be configured to be, for example, flexible, transparent, or wearable. The panel 262 and the touch panel 252 may be implemented as a single circuit. The hologram device 264 may utilize the interference of light waves to provide a three-dimensional image in empty space. The projector 266 may display an image by projecting light on a screen. The screen may be positioned, for example, inside or outside the electronic device 201. According to an embodiment, the display 260 may further include a control circuit for controlling the panel 262, the hologram device 264, or the projector 266.

The interface 270 may include, for example, a high-definition multimedia interface (HDMI) 272, a universal serial bus (USB) 274, an optical interface 276, or a D-sub-miniature (D-sub) 278. The interface 270 may be included, for example, in the communication interface 170 illustrated in FIG. 16. Additionally or alternatively, the interface 270 may include, for example, a mobile high-definition link (MHL) interface, an SD/multimedia card (MMC) interface, or an infrared data association (IrDA) interface.

The audio 280 may, for example, convert a sound to an electrical signal, and vice versa. At least a part of the components of the audio 280 may be included, for example, in the I/O interface 150 illustrated in FIG. 1. The audio 280 may process sound information input into, or output from, for example, a speaker 282, a receiver 284, an earphone 286, or the microphone 288.

The camera 291 may capture, for example, still images and a video. According to an embodiment, the camera 291 may include one or more image sensors (for example, a front sensor or a rear sensor), a lens, an image signal processor (ISP), or a flash (for example, an LED or a xenon lamp).

The power management 295 may manage power of, for example, the electronic device 201. According to an embodiment, the power management 295 may include a power management integrated circuit (PMIC), a charger IC, or a battery or fuel gauge. The PMIC may adopt wired and/or wireless charging. The wireless charging may be performed, for example, in a magnetic resonance scheme, a magnetic induction scheme, or an electromagnetic wave scheme, and may further include an additional circuit for wireless charging, for example, a coil loop, a resonance circuit, or a rectifier. The battery gauge may measure, for example, a charge level, a voltage while charging, current, or temperature of the battery 296. The battery 296 may include, for example, a rechargeable battery and/or a solar battery.

The indicator 297 may indicate specific states of the electronic device 201 or a part of the electronic device 201 (for example, the processor 210), for example, boot status, message status, or charge status. The motor 298 may convert an electrical signal into a mechanical vibration and generate vibrations or a haptic effect. While not shown, the electronic device 201 may include a processing device for supporting mobile TV (for example, a GPU). The processing device for supporting mobile TV may process media data compliant with, for example, digital multimedia broadcasting (DMB), digital video broadcasting (DVB), or MediaFLO™.

As is apparent from the foregoing description, an electronic device, for example, a waterproof electronic device according to various embodiments of the present disclosure, an opening for air ventilation between the inside and outside of the electronic device is formed along with an existing opening. Therefore, the difference between the internal and ambient atmospheric pressures of the electronic device can be maintained constant through air ventilation between the inside and outside of the electronic device, and formation or exposure of an additional external hole is suppressed. Accordingly, the exterior of the electronic device can be designed freely and rendered to be sophisticated.

Each of the above-described components of the electronic device may include one or more parts and the name of the component may vary with the type of the electronic device. According to various embodiments, the electronic device may be configured to include at least one of the afore-described components. Some component may be omitted from or added to the electronic device. According to various embodiments, one entity may be configured by combining a part of the components of the electronic device, to thereby perform the same functions of the components prior to the combining.

The embodiments disclosed in the present specification are provided for description and understanding of the present disclosure, not limiting the scope of the present disclosure. Accordingly, the scope of the present disclosure should be interpreted as embracing all modifications or various embodiments within the scope of the present disclosure therein.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
an outer housing including a first surface facing in a first direction, a second surface facing in a second direction opposite to the first direction, and a side surface surrounding at least a part of a space between the first surface and the second surface;
an inner housing mounted inside the outer housing;
an opening formed on at least one of the first surface, the second surface, or the side surface of the outer housing;
a first channel part extended from the opening between the outer housing and the inner housing;
circuitry mounted inside the inner housing;
a second channel part provided in the inner housing, connected to the opening through the first channel part, the second channel part including a first channel extended from the opening directly to the circuitry through the first channel part and a second channel provided in a vicinity of the first channel, wherein the second channel part is extended to the opening through a connection space of at least a part of the first channel part and wherein the second channel part is extended to an inner space of the inner housing; and
a stacked member mounted inside the first channel part to:
seal the first channel part; and
restrict introduction and discharge of water or moisture except for air into and from the first channel and the second channel.

2. The electronic device of claim 1, wherein the circuitry is at least one of an audio for an audio communication, a camera, a connection circuit connected to an external device, a button for applying an input, or illumination circuitry for emitting light.

3. The electronic device of claim 2, wherein the opening is at least one of a shape-matching hole for mounting the circuitry or a functional hole for mounting the circuitry, while connecting the circuitry to the outside of the electronic device.

4. The electronic device of claim 2, wherein the audio includes at least one of microphone or speaker.

5. The electronic device of claim 1, wherein the stacked member comprises:
a sealing member for sealing the first channel part; and
a foreign-material blocking member disposed between the sealing member and the second channel part.

6. The electronic device of claim 5, wherein the foreign-material blocking member comprises:
a first member for tightly sealing the first channel; and
a second member mounted to:
allow introduction and discharge of air into and from the second channel; and
restrict introduction and discharge of water or moisture into and from the second channel.

7. The electronic device of claim 6, wherein the first member is formed of a first material and the second member is formed of a second material different from the first material.

8. The electronic device of claim 5, wherein the sealing member comprises:
a sealing body mounted in the opening;
a first hole formed on the sealing body in correspondence with the first channel;
a second hole formed in a vicinity of the first hole on the sealing body in correspondence with the second channel; and
a sealing engagement surface protruding toward an inner surface of the opening from the sealing body, around the first hole and the second hole, for closely contacting an inner surface of the housing.

9. The electronic device of claim 8, wherein a connection space is provided between the first hole and the second hole for forming a connection opening connecting the second channel to the opening.

10. The electronic device of claim 1, wherein the opening comprises at least one of a shape-matching hole or a functional hole.

11. The electronic device of claim 1, wherein a connection opening is provided between the first channel and the second channel for connecting the second channel to the opening.

12. The electronic device of claim 11, wherein a sealing member is provided in the opening for sealing around the first channel and the second channel.

* * * * *